United States Patent
Yamanaka et al.

(10) Patent No.: US 6,728,524 B2
(45) Date of Patent: Apr. 27, 2004

(54) AUTOMATIC GAIN CONTROL CIRCUIT FOR CONTROLLING TWO AGC AMPLIFIERS

(75) Inventors: Kazuya Yamanaka, Tokyo (JP); Syuji Murakami, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 547 days.

(21) Appl. No.: 09/739,008

(22) Filed: Dec. 19, 2000

(65) Prior Publication Data

US 2001/0053680 A1 Dec. 20, 2001

(30) Foreign Application Priority Data

Jun. 15, 2000 (JP) .......................... 2000-180144

(51) Int. Cl.⁷ .............. H04B 1/06; H04B 7/00
(52) U.S. Cl. ............... 455/232.1; 455/234.1; 455/241.1; 455/247.1; 455/250.1
(58) Field of Search ............ 455/232.1, 234.1, 455/234.2, 241.1, 245.2, 247.1, 250.1, 253.2, 254; 375/345

(56) References Cited

U.S. PATENT DOCUMENTS 5,548,594 A * 8/1996 Nakamura .......... 370/347
5,563,916 A * 10/1996 Scarpa ................ 375/345
6,118,499 A * 9/2000 Fang .................. 348/726

FOREIGN PATENT DOCUMENTS

JP 11-154839 6/1999

* cited by examiner

Primary Examiner—Quochien B. Vuong
(74) Attorney, Agent, or Firm—Burns, Doane, Swecker & Mathis, L.L.P.

(57) ABSTRACT

An automatic gain control circuit includes a power calculator for calculating power of a modulation wave supplied to a demodulator; a power comparator for comparing the power calculated by the power calculator with ideal power of a modulation scheme of the modulation signal; a first gain controller for carrying out gain control of a first AGC amplifier in response to an output of the power comparator; and a second gain controller for carrying out gain control of the second AGC amplifier in response to the output of the power comparator. The automatic gain control circuit can solve a problem of a conventional AGC circuit in that precision gain distribution cannot be achieved to the two AGC amplifiers because the two AGC amplifiers are controlled by a single control signal output from the automatic gain control circuit.

11 Claims, 15 Drawing Sheets

FIG.4

| A | B | C | Y |
|---|---|---|---|
| 1 | 1 | 1 | 1 |
| 1 | 1 | 0 | 0 |
| 1 | 0 | 1 | 0 |
| 1 | 0 | 0 | 1 |
| 0 | 1 | 1 | 0 |
| 0 | 1 | 0 | 0 |
| 0 | 0 | 1 | 0 |
| 0 | 0 | 0 | 0 |

FIG.9

| A | B | C | Y |
|---|---|---|---|
| 1 | 1 | 1 | 0 |
| 1 | 1 | 0 | 1 |
| 1 | 0 | 1 | 0 |
| 1 | 0 | 0 | 0 |
| 0 | 1 | 1 | 1 |
| 0 | 1 | 0 | 0 |
| 0 | 0 | 1 | 0 |
| 0 | 0 | 0 | 0 |

AUTOMATIC GAIN CONTROL CIRCUIT FOR CONTROLLING TWO AGC AMPLIFIERS

BACKGROUND OF THE INVENTION

1. Field of the Invention

The present invention relates to an automatic gain control circuit, and particularly to an automatic gain control circuit installed in an amplitude control circuit of an input signal, which is used in a multiple phase shift keying system or quadrature amplitude phase modulation system.

2. Description of Related Art

Recently, as digital equipment such as personal computers becomes commonplace, data communications through networks have been implemented greatly. In addition, efficiency of limited frequency bandwidth available has been increased by bringing communications such as television broadcast into practical services utilizing digital communications technique. In such digital communications technique, quadrature amplitude modulation (abbreviated to QAM from now on) is used frequently. The QAM converts digital data into amplitude and phase information using two orthogonal functions such as sine and cosine functions to transmit the data.

FIG. 12 is a vector diagram illustrating a 16-point QAM signal constellation. The 16 QAM provides the in-phase signal and quadrature-phase signal with four values each. In FIG. 12, the I axis represents the amplitude of the in-phase component, that of a cosine wave, and the Q axis represents the amplitude of the quadrature component, that of a sine wave. A vector extending from the origin to a coordinate point (called a symbol from now on) denoted by a black point represents a composite vector of the sine wave amplitude and the cosine wave amplitude. Each symbol of the 16 QAM, which represents a discrete signal transmitted at every fixed interval, has 4-bit information.

FIG. 13 is a block diagram showing a configuration of a conventional carrier recovery system (called demodulation system from now on) of a quadrature amplitude modulation wave. In FIG. 13, the reference numeral 101 designates a tuner, 102 designates a bandpass filter, 103 designates a variable gain amplifier (also called AGC amplifier below), 104 designates a frequency converter, 105 designates an oscillator, 106 designates an A/D converter and 107 designates a demodulator.

Next, the operation of the conventional demodulation system as shown in FIG. 13 will be described. The tuner 101, receiving a modulation wave such as a terrestrial signal, satellite signal or radio frequency signal traveling through a transmission line such as a cable, converts the signal in the transmission bandwidth into a specified frequency from 30 MHz to 50 MHz, referred to as an intermediate frequency. The bandpass filter 102 removes noise outside the bandwidth of the intermediate frequency modulation wave. The AGC amplifier 103 carries out the gain control of the modulation wave from which the noise is removed. The frequency converter 104 mixes the frequency of the modulation wave with the frequency of the signal output from the oscillator 105 to convert the intermediate frequency modulation wave into a low frequency modulation wave. The A/D converter 106 performs the analog-to-digital conversion of the low frequency modulation wave. The demodulator 107 carries out digital processing to demodulate the modulation wave and to detect the transmitted digital data. To maintain the conversion accuracy of the A/D converter 106 in the demodulation system, the average amplitude of the analog signal supplied to the A/D converter 106 must be maintained at a fixed level. To achieve this, the gain of an AGC amplifier installed in the tuner 101 and that of the AGC amplifier 103 are controlled so that the average amplitude of the input signal to the A/D converter 106 is maintained at a constant level. The gain control is carried out using an automatic gain control circuit (called AGC circuit from now on) in the demodulator 107.

FIG. 14 is a block diagram showing a configuration of a conventional demodulator. In FIG. 14, reference numerals 111 and 112 each designates a multiplier, 113 and 114 each designates a lowpass filter, the reference numeral 115 designates a derotator, 116 designates a decoder, 117 designates a phase comparator, 118 designates a loop filter, and 119 designates a numerically controlled oscillator (called NCO from now on). As the lowpass filters 113 and 114, roll-off filters or root roll-off filters are used that will meet a transfer characteristic required for preventing the intersymbol interference in digital transmission. Generally, such filters are designed in such a fashion that they achieve a raised cosine characteristic to prevent the intersymbol interference when combined with filter characteristics on the transmission side.

Next, the operation of the conventional demodulator as show in FIG. 14 will be described. It is assumed here that all the processing in the demodulator is carried out digitally, because the modulation wave supplied to the data input terminal of the demodulator is the digital modulation wave passing through the A/D converter 106. The multipliers 111 and 112 multiple the modulation wave by the local oscillation signals with cosine and sine waveforms output from a fixed frequency local oscillator, thereby separating the input modulation wave into two orthogonal I- and Q-components. The lowpass filters 113 and 114, having the same frequency characteristic, carry out spectrum shaping of the outputs of the multipliers 111 and 112. The derotator 115, which is a complex multiplier, receiving the output signal from the lowpass filters 113 and 114 and data conversion signals with pseudo-sine and pseudo-cosine waveforms from the NCO 119, corrects the phase deviation and frequency deviation of the input modulation wave. The decoder 116, receiving the I- and Q-components of the input modulation wave from the derotator 115, converts the symbol information to bit streams. The phase comparator 117, receiving the I- and Q-components of the input modulation wave from the derotator 115, predicts an ideal symbol from the input information, and detects a phase difference between the ideal symbol and the actually-received symbol. The loop filter 118 smoothes the detected phase difference, and supplies the smoothed value to the frequency control terminal of the NCO 119. The NCO 119, which generates a signal with a frequency proportional to the input digital signal, has a data conversion function, and outputs the pseudo-sine and pseudo-cosine signals as digital signals. The pseudo-sine and pseudo-cosine signals output from the NCO 119 are supplied to the derotator 115 as information for correcting the phase deviation and frequency deviation of the input modulation wave as described above. When the residual frequency and phase differences are eliminated from the output signals of the derotator 115, the outputs of the decoder 116 that converts the symbol information to the bit streams conform to the transmitted digital data, thus implementing accurate demodulation.

As described above, the demodulator includes an AGC circuit. The AGC circuit receives the input modulation wave output from the A/D converter 106, or the I- and Q-components output from the lowpass filters 113 and 114.

The AGC circuit calculates the power of the modulation wave conveying the information of the input signal given as the symbol information, and detects the difference between the power of the actually-input modulation wave and a reference value representing ideal power determined for each modulation scheme by comparing them. The AGC circuit supplies a control signal calculated from the detected power difference to the AGC amplifier in the tuner 101 and to the AGC amplifier 103 after the bandpass filter 102 so that the amplitude of the input signal to the A/D converter is maintained at a fixed value.

FIG. 15 is a block diagram showing a configuration of a conventional AGC circuit. In FIG. 15, the reference numeral 121 designates a selector, 122 designates a power calculator, 123 designates a root calculator, 124 designates a subtracter, 125 designates a multiplier, 126 designates an adder, 127 designates a delay circuit, and 128 designates a pulse-width modulator (called PWM from now on). The reference symbol AGCSL designates a selection signal, AGCR designates the reference value representing the ideal power specified for each modulation scheme, and AGCG designates a parameter for specifying the rate at which the control level input to the PWM 128 reaches an optimum value. The parameter AGCG is variable and can be set freely. The adder 126 and the delay circuit 127 constitute a loop filter. The root calculator 123, which usually consists of a read-only memory (ROM), outputs the square of the input data.

Next, the operation of the conventional AGC circuit as shown in FIG. 15 will be described. The selector 121 selects either the output signal of the A/D converter 106 or the output signals of lowpass filters 113 and 114 in response to the selection signal AGCSL. The power calculator 122 squares each amplitude of the I- and Q-components of the input symbol information, and calculates the sum of the squares, $I^2+Q^2$. The root calculator 123 calculates the root of the $(I^2+Q^2)$ calculated by the power calculator 122 and obtains the power of the transmitted symbol. The subtracter 124 detects the power difference between the power calculated by the root calculator 123 and the reference value AGCR representing the ideal power specified for each modulation scheme. The reference value AGCR is the average of the power of all ideal symbol constellation points, and differs from modulation scheme to modulation scheme. The multiplier 125 multiplies the power difference between the input signal power calculated by the root calculator 123 and the ideal power by the parameter AGCG. The loop filter consisting of the adder 126 and the delay circuit 127 integrates the output from the multiplier 125 to smooth the control level to be supplied to the PWM 128. The pulse-width modulator 128, receiving the control level from the loop filter, feeds the pulse-width modulation wave based on the control level back to the AGC amplifier in the tuner 101 and to the AGC amplifier 103 so that the amplitude of the analog input signal to the A/D converter 106 is regulated at the constant value. In place of the pulse-width modulator 128, a digital-to-analog converter (abbreviated to DAC from now on) can be used for carrying out the digital-to-analog conversion of the control level output from the loop filter. In this case, the DC current output from the DAC is fed back to the pre-stage AGC amplifiers.

With the foregoing configuration, the conventional AGC circuit in the demodulation system must control the two AGC amplifiers, that is, the AGC amplifier in the tuner and the AGC amplifier after the bandpass filter 102, using only one signal it produces. However, since the two AGC amplifiers each have a specific gain characteristic, controlling the two AGC amplifiers by the single output of the AGC circuit presents a problem of making it difficult to implement precision gain distribution.

SUMMARY OF THE INVENTION

The present invention is implemented to solve the foregoing problem. It is therefore an object of the present invention to provide an AGC circuit capable of implementing precision gain distribution by making effective use of the gain characteristics specific to the two AGC amplifiers by increasing the number of the control signals output from the AGC circuit to two in order to control the two AGC amplifiers independently.

According to a first aspect of the present invention, there is provided an automatic gain control circuit installed in a demodulation system that includes a first variable gain amplifier, a second variable gain amplifier, an A/D converter for carrying out analog-to-digital conversion of a modulation wave and a demodulator for demodulating the modulation wave to recover transmitted digital data, the automatic gain control circuit controlling a gain of the first variable gain amplifier and a gain of the second variable gain amplifier to maintain average amplitude of the modulation wave to be supplied to the A/D converter at a fixed value, the automatic gain control circuit comprising: a power calculator for calculating power of a modulation wave supplied to the demodulator; a power comparator for comparing the power calculated by the power calculator with ideal power of a modulation scheme of the modulation signal; a first gain controller for carrying out gain control of the first variable gain amplifier in response to an output of the power comparator; and a second gain controller for carrying out gain control of the second variable gain amplifier in response to the output of the power comparator.

Here, the automatic gain control circuit may further comprise selecting means for selecting one of first gain control by the first gain controller and second gain control by the second gain controller in response to a total gain of the demodulation system.

The automatic gain control circuit may further comprise: first gain fixing means for retaining, while the selecting means selects the second gain control by the second gain controller, a gain of the first variable gain amplifier at a minimum or near minimum gain by fixing an output of the first gain controller; and second gain fixing means for retaining, while the selecting means selects the first gain control by the first gain controller, a gain of the second variable gain amplifier at a maximum or near maximum gain by fixing an output of the second gain controller.

The automatic gain control circuit may further comprise: first shift gain setting means for setting, when the gain control shifts from the first gain controller to the second gain controller, an output of the first gain controller such that the gain of the first variable gain amplifier is retained at a gain of the first variable gain amplifier at the gain control shift; and second shift gain setting means for setting, when the gain control shifts from the second gain controller to the first gain controller, an output of the second gain controller such that the gain of the second variable gain amplifier is retained at a gain of the second variable gain amplifier at the gain control shift.

The automatic gain control circuit may further comprise: first offset setting means for setting, when the gain control shifts from the first gain controller to the second gain controller, an output of the first gain controller such that the gain of the first variable gain amplifier is retained at a gain higher than the gain of the first variable gain amplifier immediately before the gain control shift; and second offset setting means for setting, when the gain control shifts from the second gain controller to the first gain controller, an output of the second gain controller such that the gain of the second variable gain amplifier is retained at a gain lower than the gain of the second variable gain amplifier immediately before the gain control shift.

The automatic gain control circuit may further comprise: first initial setting means for initially setting the output of the first gain controller such that the gain of the first variable gain amplifier is initially set at a maximum or near maximum gain; and second initial setting means for initially setting the output of the second gain controller such that the gain of the second variable gain amplifier is initially set at a maximum or near maximum gain.

The automatic gain control circuit may further comprise: first initial setting means for initially setting the output of the first gain controller such that the gain of the first variable gain amplifier is initially set at a predetermined gain; and second initial setting means for initially setting the output of the second gain controller such that the gain of the second variable gain amplifier is initially set at a maximum or near maximum gain.

The automatic gain control circuit may further comprise: first initial setting means for initially setting the output of the first gain controller such that the gain of the first variable gain amplifier is initially set at a minimum or near minimum gain; and second initial setting means for initially setting the output of the second gain controller such that the gain of the second variable gain amplifier is initially set at a predetermined gain.

BRIEF DESCRIPTION OF THE DRAWINGS

FIG. 4 is a truth table used for deciding a control direction in a control direction decision circuit 24 of the embodiment 1;

FIG. 9 is a truth table used for deciding a control direction in the control direction decision circuit 24 of the embodiment 3;

DETAILED DESCRIPTION OF THE PREFERRED EMBODIMENTS

The invention will now be described with reference to the accompanying drawings.

Embodiment 1

Figure 1A:
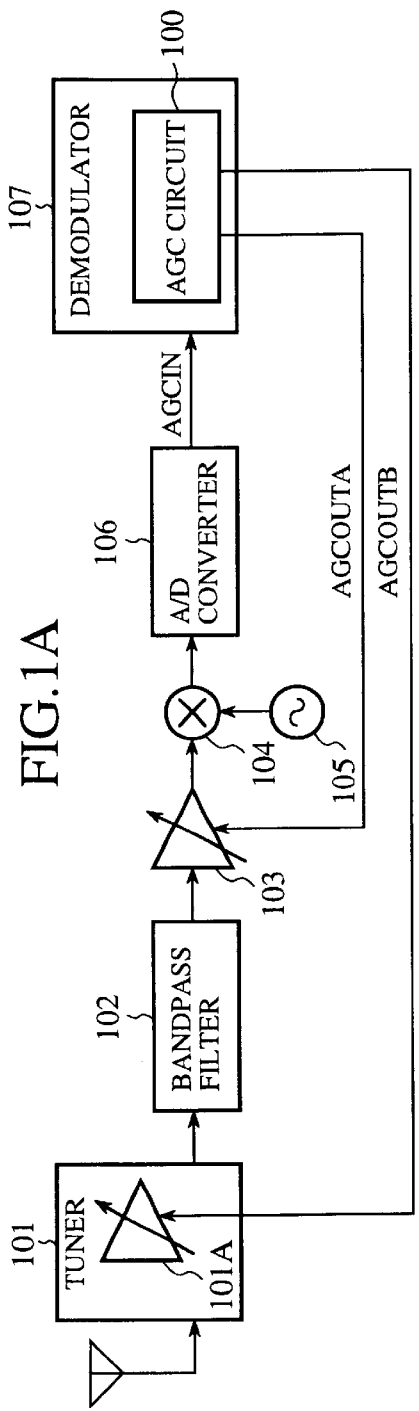
FIG. 1A is a block diagram showing a configuration of a demodulation system to which an AGC circuit in accordance with the present invention is applied.
Figure 13:
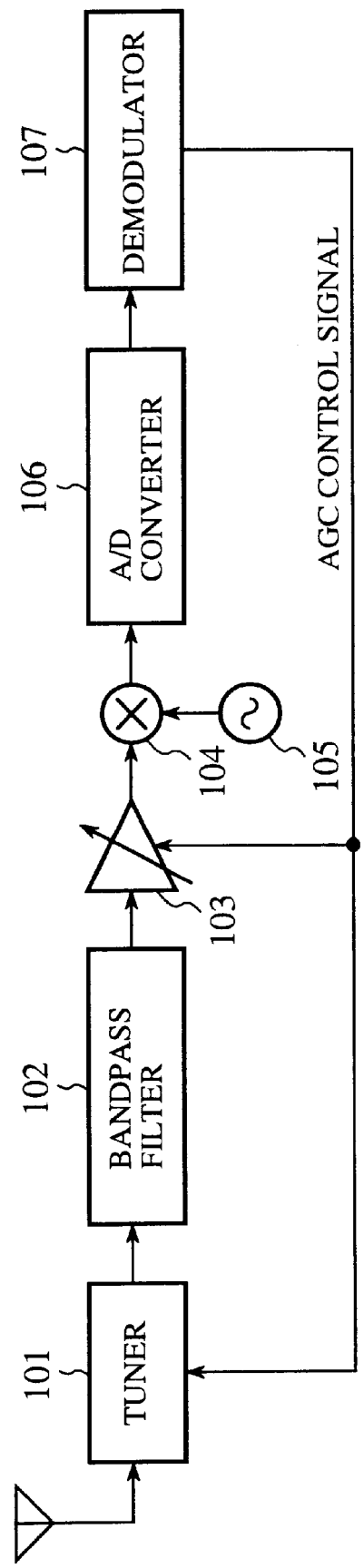
FIG. 13 is a block diagram showing a conventional demodulation system of a quadrature amplitude modulation wave.
Figure 14:
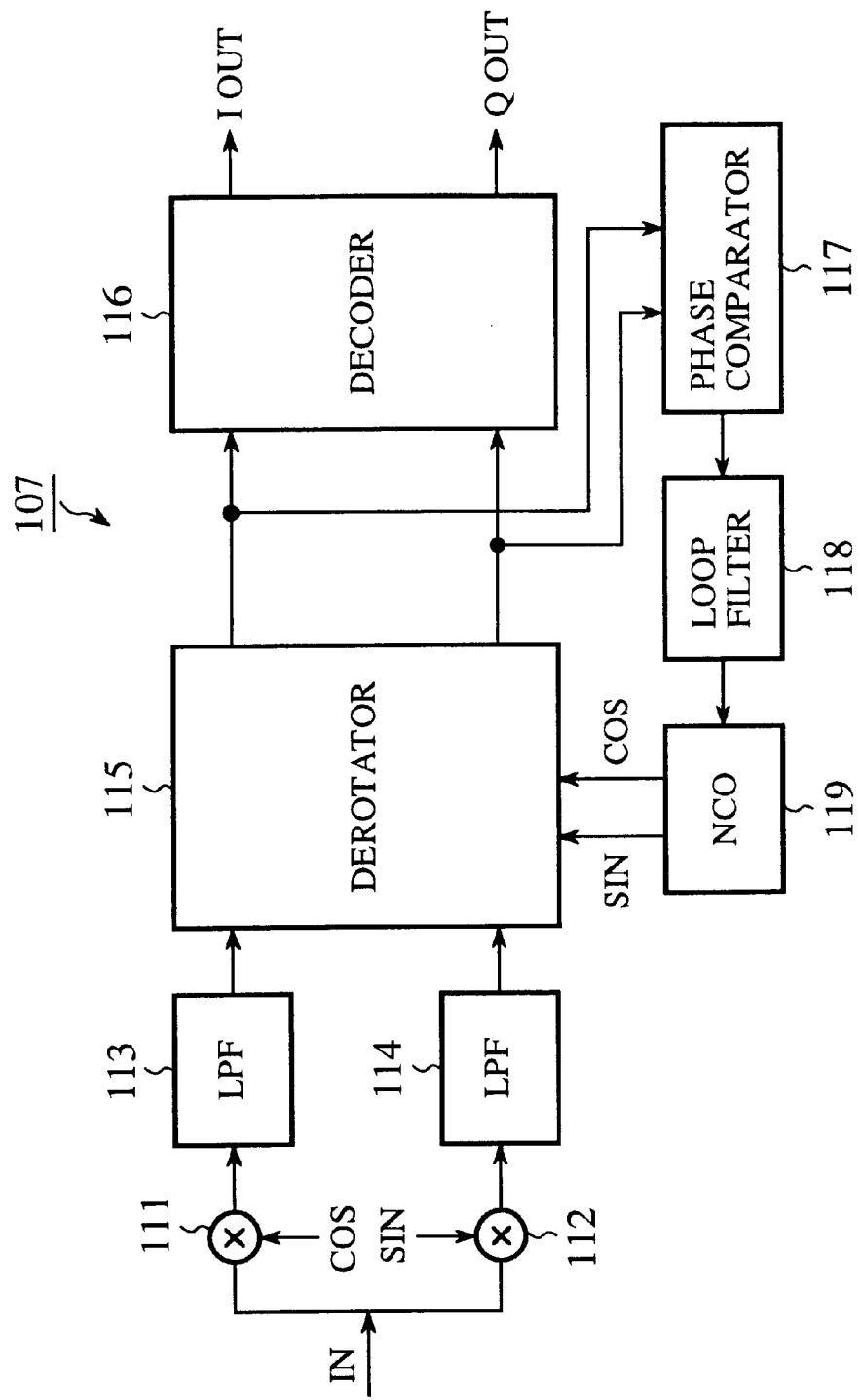
FIG. 14 is a block diagram showing a configuration of a demodulator 107 in the conventional demodulation system.
Figure 15:
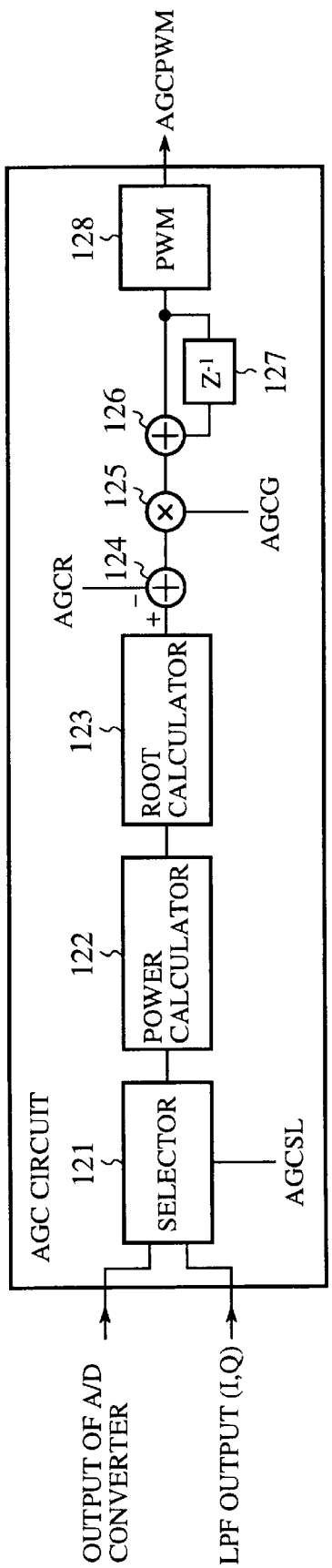
FIG. 15 is a block diagram showing a configuration of an AGC circuit installed in the demodulator 107.

FIG. 1A is a block diagram showing a configuration of a demodulation system to which an AGC circuit in accordance with the present invention is applied. In FIG. 1A, the reference numeral 101A designates an AGC amplifier in the tuner 101, and 100 designates an AGC circuit in accordance with the present invention. Since the remaining configuration of the demodulation system is the same as that of the conventional demodulation system as shown in FIG. 13, the description thereof is omitted here. The demodulation system of FIG. 1A differs from the conventional demodulation system as shown in FIG. 13 in that its AGC circuit 100 outputs two AGC control signals AGCOUTA and AGCOUTB to control the AGC amplifiers 101A and 103 independently. It is assumed here that the total gain of the demodulation system in the present embodiment 1 is considered to be the sum of the gain of the AGC amplifier 101A (abbreviated to RFAGC from now on) in the tuner 101 and the gain of the AGC amplifier 103 (abbreviated to IFAGC from now on) after the bandpass filter.

Figure 1B:
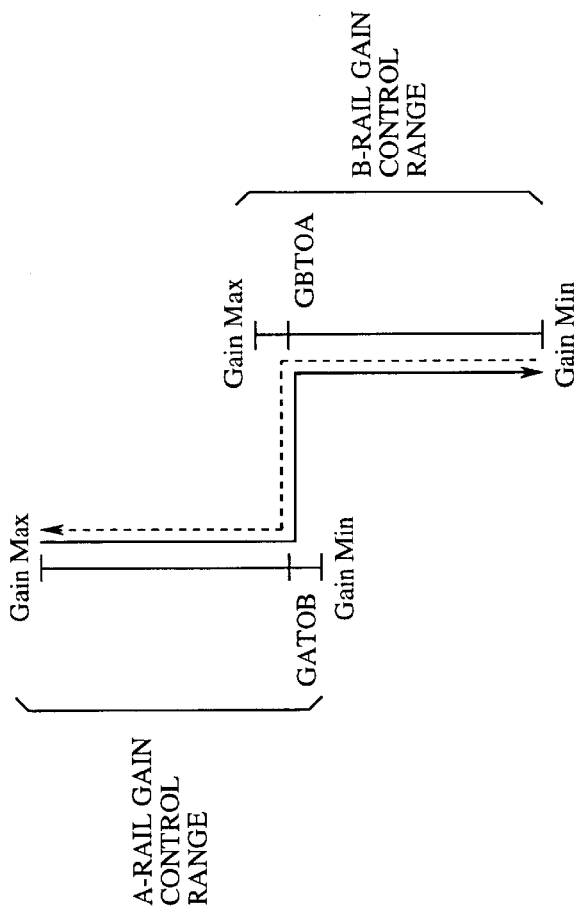
FIG. 1B is a diagram illustrating gain control ranges of two rails in an embodiment 1 of the AGC circuit in accordance with the present invention.

First, a fundamental gain control process of the present embodiment 1 of the AGC circuit will be described. FIG. 1B is a diagram illustrating individual gain control ranges of two gain control means (rails) in the embodiment 1 of the AGC circuit in accordance with the present invention. As illustrated in FIG. 1B, the AGC circuit controls the entire demodulation system by dividing its control range into a control range an AGC control output A takes charge of (referred to as A-rail from now on), and a control range an AGC control output B takes charge of (called B-rail from now on). Thus, the A-rail and B-rail never change simultaneously.

In FIG. 1B, the A-rail control range is drawn above the B-rail control range. It represents the idea that when the demodulation system achieves a rather high total gain, the B-rail gain is fixed at a maximum or near maximum gain, and the A-rail gain is adjusted to a gain appropriate to implement the rather high total gain, and that when the demodulation system achieves a rather low total gain, the A-rail gain is fixed at a minimum or near minimum gain, and the B-rail gain is adjusted to a gain appropriate to implement the rather low total gain. Accordingly, even when variables GATOB and GBTOA are drawn at the same level, these variables are not necessarily the same value, where the variables GATOB and GBTOA designate a gain of the AGC amplifier connected to the A-rail when the gain control shifts from the A-rail to the B-rail, and a gain of the AGC amplifier connected to the B-rail when the gain control shifts from the B-rail to the A-rail, respectively. Although the A-rail and B-rail are connected to the IFAGC 103 and RFAGC 101A, respectively, in FIG. 1A, they can be connected to the RFAGC 101A and IFAGC 103, respectively, to achieve the gain control.

Next, the basic control operation will be described. First, when no signal is input to the A/D converter 106, both the A-rail and B-rail are placed at the maximum or near maximum gain, or the A-rail is placed at a specified gain corresponding to a modulation scheme and the B-rail is placed close to the maximum gain, entering a standby mode. When the signal is input to the A/D converter 106, the AGC circuit 100 controls the A-rail such that the gain of the AGC amplifier connected to the A-rail is reduced, first. In the course of this, the gain of the B-rail is maintained at the maximum or near maximum gain. When the gain optimizing the amplitude of the input signal to the A/D converter is out of the A-rail control range, that is, when the gain of the AGC amplifier connected to the A-rail is still greater than the optimum value even when it is minimum, the AGC circuit fixes the output of the A-rail at the specified gain near the minimum gain, and controls the B-rail such that it detects the optimum gain by reducing the gain of the AGC amplifier connected to the B-rail. Likewise, when gain optimizing the amplitude of the input signal to the A/D converter exceeds the B-rail control range after the control has once shifted from the A-rail to the B-rail, that is, when the gain of the AGC amplifier connected to the B-rail is still less than the optimum value even when it is maximum, the AGC circuit fixes the output of the B-rail at a specified gain near the maximum gain, and controls the A-rail such that it detects the optimum gain by increasing the gain of the AGC amplifier connected to the A-rail.

Figure 2:
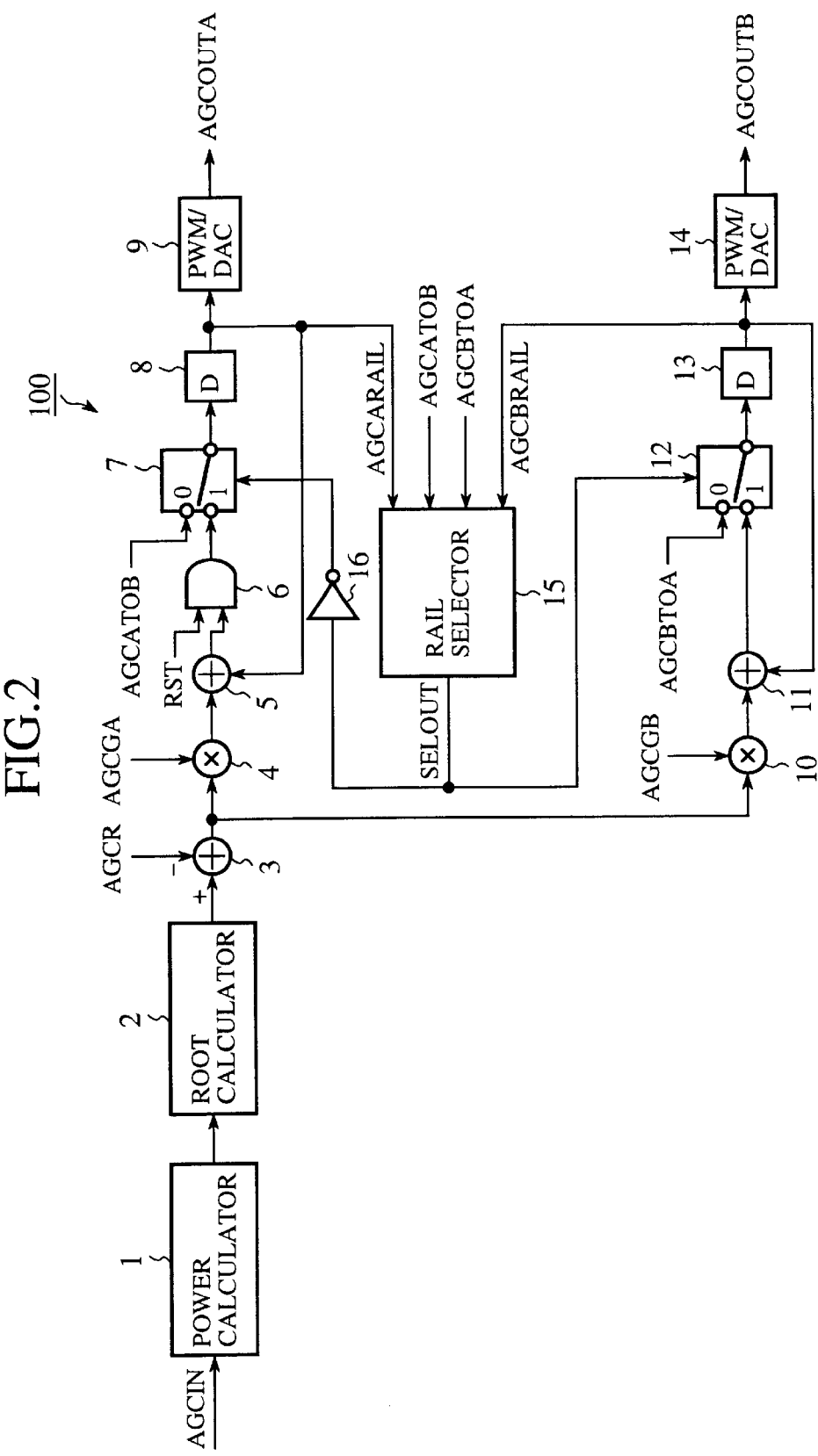
FIG. 2 is a block diagram showing a configuration of the embodiment 1 of the AGC circuit in accordance with the present invention.

FIG. 2 is a block diagram showing a configuration of the embodiment 1 of the AGC circuit 100. In FIG. 2, the reference numeral 1 designates a power calculator for receiving the output signal from the A/D converter and the like, and for calculating the square of the power of a transmitted symbol; 2 designates a root calculator for calculating the power of the symbol; 3 designates a subtracter for obtaining the power difference between the calculated power and the ideal power AGCR; 4 designates a multiplier for multiplying the power difference by a parameter AGCGA; 5 designates an adder constituting a loop filter for smoothing the control level to be supplied to a PWM/DAC 9 by integrating the output value from the multiplier 4; 6 designates an AND circuit whose first input is supplied with an active-low reset signal to initialize the control level; 7 designates a selector with its first input is set at the control level AGCATOB; 8 designates a flip-flop for latching the output value from the selector 7; 9 designates the PWM/DC (PWM circuit or DAC) for generating a control signal for controlling the AGC amplifier connected thereto in response to the control level output from the loop filter; 10 designates a multiplier for multiplying the power difference by a parameter AGCGB; 11 designates an adder constituting a loop filter for smoothing the control level to be supplied to a PWM/DAC 14 by integrating the output value from the multiplier 10; 12 designates a selector with its first input is set at the control level AGCBTOB; 13 designates a flip-flop for latching the output value from the selector 12; 14 designates the PWM/DC (PWM circuit or DAC) for generating a control signal for controlling the AGC amplifier connected thereto in response to the control level output from the loop filter; 15 designates a rail selector that receives the control level AGCARAIL, specified control level AGCATOB associated with the A-rail, control level AGCBRAIL and specified control level AGCBTOA associated with the B-rail, and that supplies a selection signal SELOUT to the selector 7 and selector 12 in response to the control levels; and 16 designates an inverter. Here, the root calculator 2, which is usually consists of a read-only memory (ROM), outputs the square of the input data.

The reference symbol AGCR designates a reference value representing the ideal power specified for each modulation scheme; AGCGA designates the parameter variable for specifying the rate at which the control level input to the PWM/DAC 9 reaches an optimum value; AGCGB designates the parameter variable for specifying the rate at which the control level input to the PWM/DAC 14 reaches an optimum value; AGCOUTA designates a control signal to be supplied from the PWM/DAC 9 to the AGC amplifier connected to the A-rail; and AGCOUTB designates a control signal to be supplied from the PWM/DAC 14 to the AGC amplifier connected to the B-rail as shown in FIG. 1A. The variable AGCATOB designates a control level corresponding to the specified gain GATOB of the AGC amplifier connected to the A-rail at the control rail transition as illustrated in FIG. 1B; and the variable AGCBTOA designates a control level corresponding to the specified gain GBTOA of the AGC amplifier connected to the B-rail at the control rail transition as illustrated in FIG. 1B. Accordingly, when the control level AGCATOB is input to the PWM/DAC 9, the gain of the AGC amplifier connected to the A-rail is set at the GATOB, and when the control level AGCBTOA is input to the PWM/DAC 14, the gain of the AGC amplifier connected to the B-rail is set at the GBTOA.

Next, the entire operation of the present embodiment 1 of the AGC circuit will be described.

Receiving the signal AGCIN, which is supplied as either the digital modulation wave output from the A/D converter 106 or the demodulation signal obtained by the quadrature demodulation of the modulation wave, followed by wave shaping by a roll-off filter, the power calculator 122 squares each amplitude of the I- and Q-components of the input symbol information, and calculates the sum of the squares, $I^2+Q^2$ The root calculator 2 calculates the root of the $(I^2+Q^2)$ calculated by the power calculator 1 to obtain the power of the transmitted symbol. The subtracter 3 detects the power difference between the power calculated by the root calculator 2 and the reference value AGCR representing the ideal power specified for each modulation scheme. The reference value is the average of the power of all ideal symbol constellation points, and differs from modulation scheme to modulation scheme. Then, the power difference obtained by the subtracter 3 is delivered to the A-rail and B-rail to be processed. The multiplier 4 multiplies the power difference by the appropriate parameter AGCGA so that a proper control level is set quickly to the PWM/DAC 9. The adder 5 integrates the values successively output from the multiplier 4, and supplies the PWM/DAC 9 with the smoothed proper control level. The flip-flop 8 latches the control level, and supplies it to the PWM/DAC 9 and adder 5. The PWM/DAC 9 receives the control level, and outputs the control signal AGCOUTA to control the gain of the AGC amplifier connected thereto. The PWM/DAC 9 carries out control such that the gain of the AGC amplifier becomes maximum when the control level is zero, and reduces the gain with an increase in the control level. The operation of the AND circuit 6 and selector 7 will be described later.

Likewise, in the process in the B-rail, the multiplier 10 multiplies the power difference by the appropriate parameter AGCGB so that a proper control level is set quickly to the PWM/DAC 14. The adder 11 integrates the values successively output from the multiplier 10, and supplies the PWM/DAC 14 with the smoothed proper control level. The flip-flop 13 latches the control level, and supplies it to the PWM/DAC 14 and adder 11. The PWM/DAC 14 receives the control level, and outputs the control signal AGCOUTB to control the gain of the AGC amplifier connected thereto. The PWM/DAC 14 carries out control such that the gain of the AGC amplifier becomes maximum when the control level is zero, and reduces the gain with an increase in the control level. The operation of the selector 12 will be described later.

Next, the control of the AGC amplifier by the AGC circuit will be described.

First, the control levels AGCATOB and AGCBTOA are specified externally. Here, the control level AGCATOB is the value to be supplied to the PWM/DAC 9 within the A-rail when the gain optimizing the amplitude of the input signal to the A/D converter falls below the A-rail control range, and hence the control is switched to the B-rail. On the other hand, the control level AGCBTOA is a value to be supplied to the PWM/DAC 14 within the B-rail when the optimum gain exceeds the B-rail control range after the gain is made stable within the range controllable by the B-rail, and hence the control is switched to the A-rail. Subsequently, when the power is turned on, the rail selector 15 outputs the "L" level rail selection signal so that the PWM/DAC 9 is supplied with the output of the loop filter, and the PWM/DAC 14 is supplied with the specified control level AGCBTOA. In addition, to reset the A-rail loop filter, the AND circuit 6 is supplied with the "L" level reset signal. Thus, the PWM/DAC 9 is supplied with the zero control level. Setting the loop filter at its minimum value in this way is equivalent to set the AGC amplifier, which is connected to and controlled by the PWM/DAC 9, at a standby mode at the maximum gain. In this case, since the input signal at the maximum gain is supplied to the A/D converter 106, the output from the subtracter 3 becomes positive, so that the increasing control level is supplied to the PWM/DAC 9, and the gain of the AGC amplifier connected to the PWM/DAC 9 is gradually reduced. As a result, with the elapse of the time, the PWM/DAC 9 is supplied with the control level that will provide the optimum gain by the effect of the loop filter. In the course of this, the PWM/DAC 14 of the B-rail is continuously supplied with the specified control level AGCBTOA.

Next, if it is necessary to further reduce the gain even when the control level supplied to the PWM/DAC 9 reaches the specified control level AGCATOB, the rail selector 15 outputs the "H" level rail selection signal in order to set specified control level AGCATOB to the PWM/DAC 9, to supply the PWM/DAC 14 with the output of the loop filter, and to switch the gain control to the B-rail. When the gain is still higher than the optimum gain given by the control level AGCBTOA, the output from the subtracter 3 becomes positive, and the control level supplied to the PWM/DAC 14 is gradually increased so that the gain of the AGC amplifier connected to the PWM/DAC 14 is gradually decreased, and thus the control level optimizing the gain is supplied to the PWM/DAC 14 by the effect of the loop filter. In the course of this, the A-rail PWM/DAC 9 is continuously supplied with the specified control level AGCATOB.

In contrast, when the amplitude of the input signal to the A/D converter sharply drops because of a channel switching or the like after the gain becomes stable in the B-rail, the output from the subtracter 3 falls negative so that the control level supplied to the PWM/DAC 14 is gradually reduced and the gain of the AGC amplifier connected to the PWM/DAC 14 is increased, thereby supplying the PWM/DAC 14 with the control level optimizing the gain by the effect of the loop filter. If it is necessary to further increase the gain even when the control level supplied to the PWM/DAC 14 reaches the specified control level AGCBTOA, the rail selector 15 supplies the "L" level rail selection signal to the selector 7 and selector 12 to supply the PWM/DAC 9 with the output of the loop filter and the PWM/DAC 14 with the specified control level AGCBTOA, and to switch the gain control to the A-rail. When the gain given by the control level AGCATOB is still lower than the optimum gain, the output from the subtracter 3 becomes negative so that the control level supplied to the PWM/DAC 9 is gradually reduced and the gain of the AGC amplifier connected to the PWM/DAC 9 is gradually increased. Thus, the control level optimizing the gain is supplied to the PWM/DAC 9 by the effect of the loop filter.

As described above, the rail selector 15 halts the operation of the B-rail loop filter while the A-rail loop filter is operating, whereas it stops the operation of the A-rail loop filter while the B-rail loop filter is operating. The control levels smoothed by the loop filters in the A-rail and B-rail are fed back as DC components from the PWMs or DACs to the pre-stage IFAGC 103 and RFAGC 101A through lowpass filters, thereby controlling the average amplitude of the input signal to the A/D converter 106 to be maintained at the fixed value.

Figure 3:
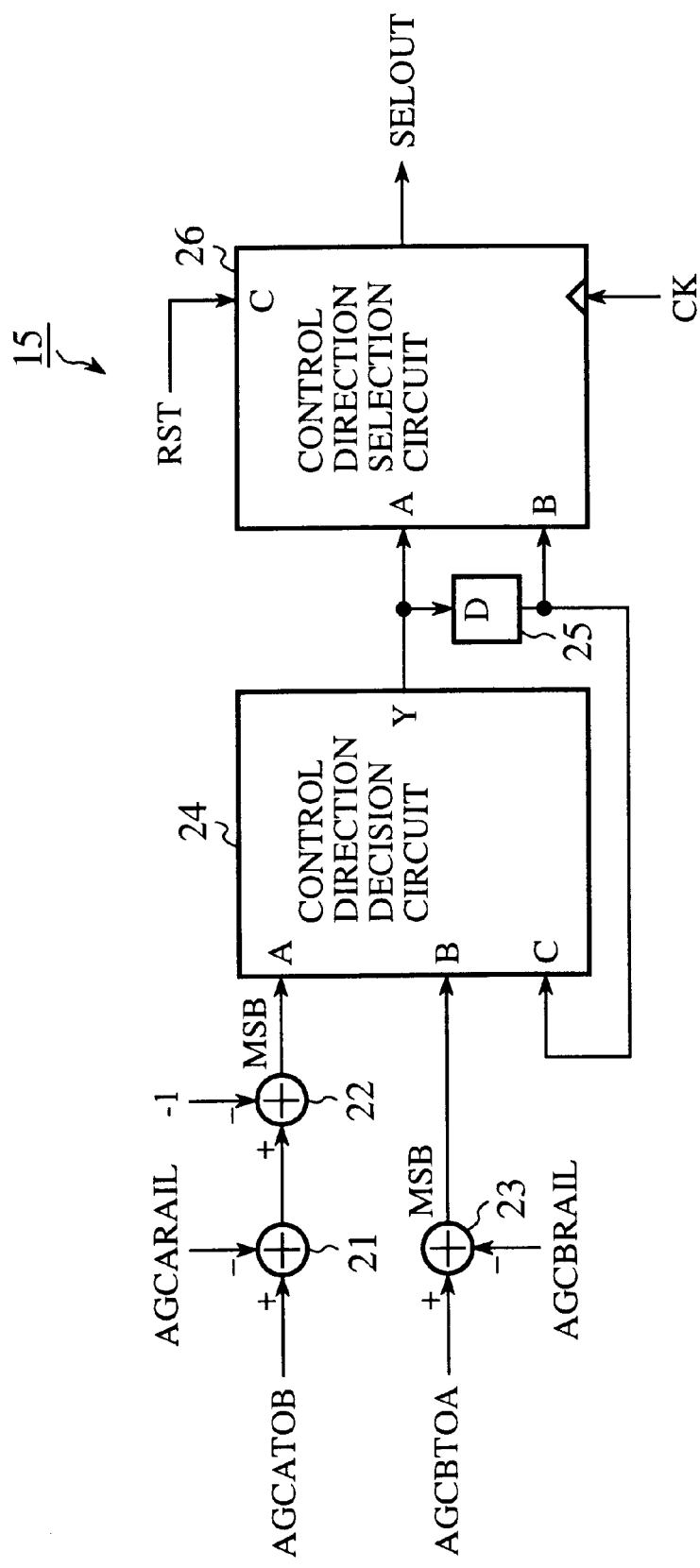
FIG. 3 is a block diagram showing a configuration of a rail selector 15 in the embodiment 1 of the AGC circuit in accordance with the present invention.

Next, the rail selector 15 for switching the gain control between the A-rail and B-rail will be described. FIG. 3 is a block diagram showing a configuration of the rail selector 15 of the present embodiment 1. In FIG. 3, the reference numeral 21 designates a subtracter for subtracting the control level AGCARAIL to be supplied to the PWM/DAC 9 of the A-rail from the specified control level AGCATOB in the A-rail; 22 designates a subtracter for subtracting one from the least significant bit (abbreviated to LSB from now on) of the output of the subtracter 21, which is represented in a binary number, in order to switch the gain control to the B-rail when the A-rail control level AGCARAIL reaches the AGCATOB; 23 designates a subtracter for subtracting the control level AGCBRAIL to be supplied to the PWM/DAC 14 of the B-rail from the specified control level AGCBTOA in the B-rail; 24 designates a control direction decision circuit for deciding the direction of the gain control from the MSB of the subtraction result in the A-rail, the MSB of the subtraction result in B-rail and the result of the control direction decision in the immediately previous cycle; 25 designates a flip-flop for latching the decision result output from the control direction decision circuit 24; and 26 designates a control direction selection circuit for detecting a point of the rail switching using the output of the control direction decision circuit 24, and for holding the changed direction during specified N cycles of the clock signal. Incidentally, the subtracters operate on the basis of the two's complement binary. Accordingly, the calculation results in both the A-rail and B-rail are output in the two's complement. Thus, the most significant bit (MSB) of a negative output is one.

FIG. 4 shows a truth table used in the control direction decision circuit 24 for deciding the control direction. In FIG. 4, A designates the MSB of the subtraction result in the A-rail (the output of the subtracter 22); B designates the MSB of the subtraction result in the B-rail (the output of the subtracter 23); C designates a decision result in the immediately previous cycle; and Y designates a decision result output from the control direction decision circuit 24. As for the decision result Y, when it is zero the A-rail is selected, and when it is one the B-rail is selected.

Next, the operation of the rail selector 15 will be described.

When the reset signal is output at turn-on, the initial value of the decision direction is set at "0". Thus, the control by the A-rail is selected, and the A-rail control level AGCAR-AIL is placed at "0", and the B-rail control level AGCBRAIL is placed at AGCBTOA. The subtraction result in the A-rail in the rail selector 15 is positive, and the subtraction result in the B-rail is zero, placing both the MSBs at zero. In addition, as described above, the result of the control direction decision in the immediately previous cycle equals the initial value "0", thereby resulting in (A, B, C)=(0, 0, 0). In this case, since the output value Y of the control direction decision circuit becomes zero, the gain control by the A-rail is selected.

Subsequently, when the A-rail control level, that is, the output of the loop filter, is equal to AGCATOB, the subtraction result in the A-rail becomes negative, placing the MSB of the subtraction result at one. Since the A-rail is selected in the previous cycle, the input C is zero, resulting in (A, B, C)=(1, 0, 0). In this case, the output value Y of the control direction decision circuit 24 is placed at one, so that the gain control is switched to the B-rail, thereby selecting the gain control by the B-rail. Thus, the output of the rail selector 15 is switched from "L" level to "H" level.

When the B-rail is selected, the output control level of the A-rail is fixed at AGCATOB, and the subtraction result in the A-rail becomes negative, thereby placing the MSB of the subtraction result at one. When the B-rail control level, that is, the output of the loop filter exceeds AGCBTOA to reduce the gain of the AGC amplifier, the subtraction result in the B-rail becomes negative, placing the MSB of the subtraction result at one. Since the B-rail is selected in the previous cycle, the input C is one, resulting in (A, B, C)=(1, 1, 1) which continues to select the B-rail.

In contrast, when the amplitude of the input signal to the A/D converter 106 drops sharply because of the channel switching or the like after the gain in the B-rail is stabilized, the state (A, B, C)=(1, 1, 1) is held until the B-rail control level AGCBRAIL reaches the specified control level AGCB-TOA. However, once the B-rail control level reaches the specified control level AGCBTOA, the state changes to (A, B, C)=(1, 0, 1), in which case, the output value Y of the control direction decision circuit 24 is placed at zero to switch the gain control to the A-rail, thereby selecting the control by the A-rail. Thus, the output of the rail selector 15 is switched from "H" level to "L" level.

When the A-rail is selected, the output of the B-rail control level is fixed at AGCBTOA, and the subtraction result in the B-rail becomes zero, thereby placing the MSB of the subtraction result at zero. When the A-rail control level AGCARAIL, that is, the output of the loop filter drops below AGCATOB to increase the gain of the AGC amplifier, the subtraction result in the A-rail becomes positive or zero, placing the MSB of the subtraction result at zero. Since the A-rail is selected in the previous cycle, the input C is zero, resulting in (A, B, C)=(0, 0, 0) which continues to select the A-rail.

The state (A, B, C) of the control direction decision circuit 24 changes as described above. In the truth table as shown in FIG. 4, the states represented by (A, B, C)=(1, 1, 0), (A, B, C)=(0, 1, 1), (A, B, C)=(0, 1, 0) and (A, B, C)=(0, 0, 1) do not take place in the actual gain control. Accordingly, the output value Y can take any value. Here, the decision result for selecting the A-rail is given higher priority.

The control direction selection circuit 26 detects the point of the rail switching in response to the output of the control direction decision circuit 24, and holds the control in the rail selected for specified N cycles of the clock signal after switching. Thus, it can prevent the rail in charge of the gain control from being switched often near the point of the rail switching, thereby stabilizing the gain of the entire system. Any number of cycles is allowable as long as it is greater than or equal to one, which can be determined considering the stability of the entire system. Finally, the output SELOUT of the control direction selection circuit 26 becomes the output of the rail selector 15.

As described above, according to the present embodiment 1, the power calculator 1 and root calculator 2 constitute a power calculator for calculating the power of the modulation wave input to the demodulator; the subtracter 3 constitutes a power comparator comparing the power calculated by the power calculator with the ideal power of the modulation scheme employed; the A-rail loop filter, PWM/DAC 9 etc. constitute a first gain controller for carrying out the gain control of the first variable gain amplifier (IFAGC 103 in FIG. 1A) in response to the output of the power comparator; and the B-rail loop filter, PWM/DAC 14 etc. constitute a second gain controller for carrying out the gain control of the second variable gain amplifier (RFAGC 101A in FIG. 1A) in response to the output of the power comparator. The configuration comprising the power calculator, power comparator, first gain controller and second gain controller offers an advantage of being able to implement a precision gain distribution by enabling the first variable gain amplifier and second variable gain amplifier to be controlled independently, thereby making effective use of the gain characteristic specific to the two variable gain amplifiers.

Furthermore, the present embodiment 1 is configured such that it comprises the rail selector 15 (selecting means) for selecting one of the gain control by the A-rail (first gain controller) and the gain control by the B-rail (second gain controller) in response to the control ranges of the gain control of the entire demodulation system. Accordingly, the rail selector 15 activates one of the first gain controller and second gain controller during the gain control to implement the optimum gain by varying the total gain of the demodulation system in one direction, that is, by only increasing or decreasing it. This offers an advantage of being able to implement the gain control easily and positively without using complicated control algorithm.

In addition, the rail selector 15, selector 7, PWM/DAC 9 etc. constitute a first gain fixing means for fixing the output of the first gain controller (corresponding to the output value AGCATOB supplied to the PWM/DAC 9) to hold the gain of the first variable gain amplifier at the minimum or near minimum gain (GATOB) while the second gain controller carries out the gain control in response to the selection of the selecting means; and the rail selector 15, selector 12, PWM/DAC 14 etc. constitute a second gain fixing means for fixing the output of the second gain controller (corresponding to the output value AGCBTOA supplied to the PWM/DAC 14) to hold the gain of the second variable gain amplifier at the maximum or near maximum gain (GBTOA) while the first gain controller selects the gain control in response to the selection of the selecting means. The configuration comprising the first gain fixing means and the second gain fixing means enables the first gain controller to implement the gain control in the rather higher range of the total gain of the demodulation system, and the second gain controller to implement the gain control in the rather lower range of the total gain. This offers an advantage of being able to select one of the gain controllers in response to the gain control ranges of the total gain of the demodulation system, and to simplify the operation by providing instructions on the gain control at an initial stage of the operation.

Moreover, the rail selector 15 including the control direction decision circuit 24, the selector 7, PWM/DAC 9 etc. constitute a first shift gain setting means for setting the output of the first gain controller (corresponding to the output value AGCATOB supplied to the PWM/DAC 9) so that the gain of the first variable gain amplifier is held to the gain (GATOB) at the time the gain control is switched from the A-rail (first gain controller) to the B-rail (second gain controller); and the rail selector 15 including the control direction decision circuit 24, the selector 12, PWM/DAC 14 etc. constitute a second shift gain setting means for setting the output of the second gain controller (corresponding to the output value AGCBTOA supplied to the PWM/DAC 14) so that the gain of the second variable gain amplifier is held to the gain (GBTOA) at the time the gain control is switched from the B-rail to the A-rail. The configuration comprising the first shift gain setting means and second shift gain setting means makes it possible to successively operate the first gain controller and second gain controller to continuously increase or decrease the total gain of the demodulation system, thereby implementing the optimum gain. This offers an advantage of being able to implement the gain control consistently and rapidly.

Finally, the rail selector 15, selector 7, AND circuit 6, PWM/DAC 9 etc. constitute a first initial setting means for initially setting the output value of the first gain controller (corresponding to the output value "0" supplied to the PWM/DAC 9) in order to initially set the first variable gain amplifier at the maximum or near maximum gain; and the rail selector 15, selector 12, PWM/DAC 14 etc. constitute a second initial setting means for initially setting the output value of the second gain controller (corresponding to the value AGCBTOA supplied to the PWM/DAC 14) in order to initially set the second variable gain amplifier at the maximum or near maximum gain. The configuration comprising the first initial setting means and second initial setting means enables the demodulation system to initially set the total gain at the maximum or near maximum gain, thereby making it possible to reach the optimum gain by only reducing the total gain of the demodulation system. This offers an advantage of being able to implement the gain control consistently in a simpler process.

Embodiment 2

Figure 5:
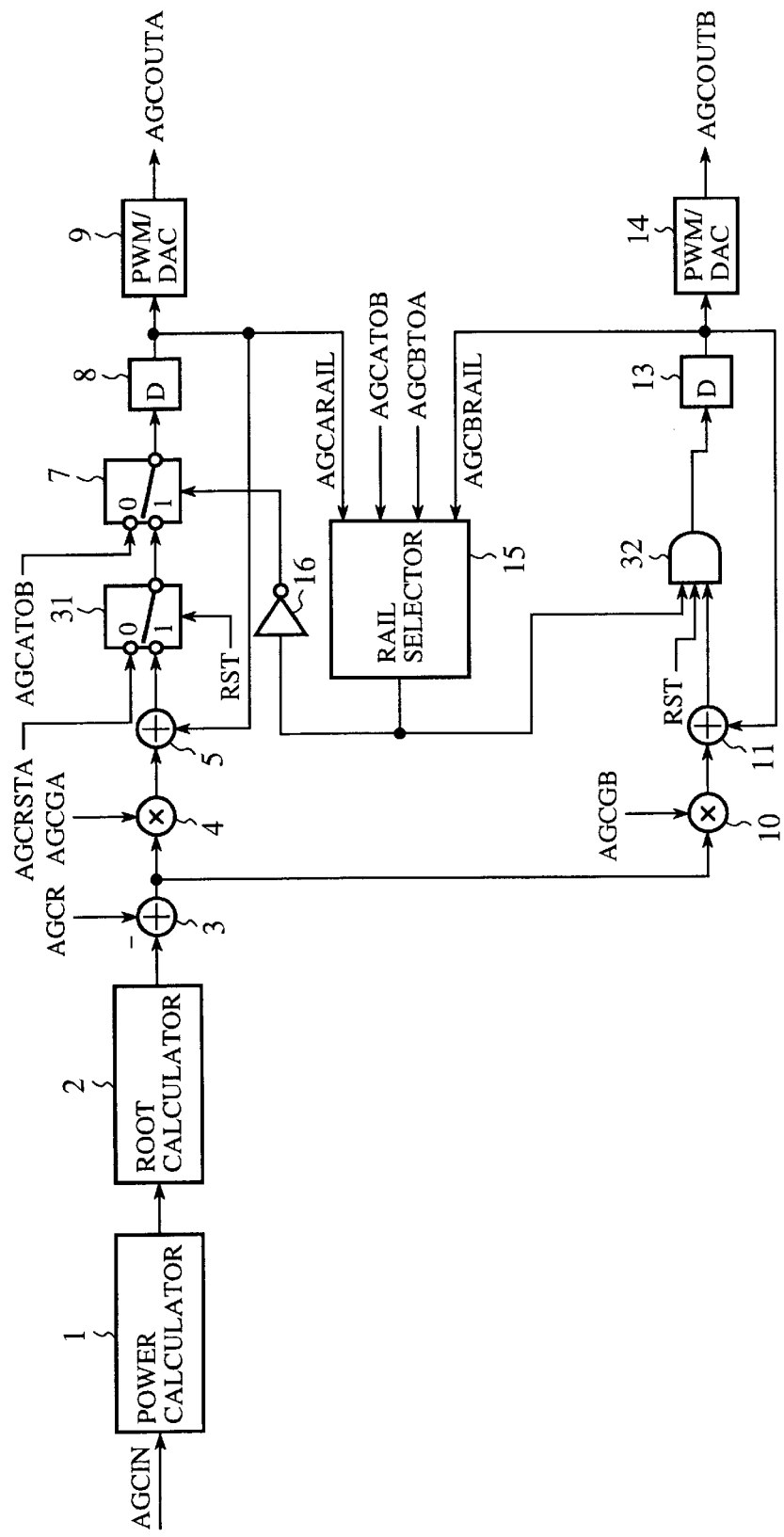
FIG. 5 is a block diagram showing a configuration of an embodiment 2 of the AGC circuit in accordance with the present invention.

FIG. 5 is a block diagram showing a configuration of an embodiment 2 of the AGC circuit in accordance with the present invention. In FIG. 5, the same reference numerals designate the same or like portions to those of FIG. 2, and the description thereof is omitted here. In FIG. 5, the reference numeral 31 designates a selector for setting at AGCRSTA the initial value of the control level supplied from the A-rail loop filter to the PWM/DAC 9 at the reset; and 32 designates an AND circuit for setting at the minimum value zero the initial value of the control level supplied from the B-rail loop filter to the PWM/DAC 14 at the reset, and for setting the B-rail control level AGCBRAIL at the minimum value zero when the B-rail is not selected during the gain control.

Next, the operation of the present embodiment 2 will be described. Since the operations of the components other than the selector 31 and AND circuit 32 is the same as those of the embodiment 1, the description thereof is omitted here. Receiving the "L" level reset signal at turn-on, the selector 31 supplies the A-rail loop filter with the predetermined control level AGCRSTA. At the same time, receiving the "L" level reset signal, the AND circuit 32 supplies the B-rail loop filter with the control level of zero. The AND circuit 32 also receives the "L" level rail selection signal from the rail selector 15 when the B-rail is not selected during the gain control, and outputs the zero control level as the B-rail control level AGCBRAIL.

Next, the control operation of the AGC amplifiers will be described. It is basically the same as the control operation of the AGC amplifiers in the embodiment 1. Hence, only the different operation from that of the embodiment 1 will be described. First, the initial control level of the A-rail AGCRSTA is externally specified besides the specified control levels AGCATOB and AGCBTOA. Subsequently, when the power is turned on, the "L" level reset signal is supplied to the selector 31 and AND circuit 32. Receiving the reset signal, the selector 31 supplies the A-rail loop filter with the control level AGCRSTA, and the AND circuit 32 supplies the B-rail loop filter with the control level AGCBRAIL of zero. Then, the rail selector 15 supplies the "L" level rail selection signal to the selector 7 and AND circuit 32, thereby selecting the A-rail. The "L" level rail selection signal is inverted to the "H" level signal through the inverter 16, and hence the PWM/DAC 9 is supplied with the control level AGCRSTA as the output of the loop filter. Thus, the AGC amplifier connected to the A-rail waits for the input signal at the gain corresponding to the control level AGCRSTA. On the other hand, receiving the "L" level rail selection signal, the AND circuit 32 supplies the PWM/DAC 14 with the control level of zero. In response to this, the AGC amplifier connected to the B-rail waits for the input signal at the maximum gain corresponding to the control level of zero.

As clearly seen from the circuit configuration, when the rail selector 15 outputs the "L" level rail selection signal to select the A-rail gain control, the AND circuit 32 outputs zero to place the B-rail control level AGCBRAIL at zero, thereby holding the gain of the AGC amplifier connected to the B-rail at the maximum gain during the gain control by the A-rail. In contrast, when the rail selector 15 outputs the "H" level rail selection signal to select the B-rail gain control, the output of the loop filter is set as the B-rail control level AGCBRAIL.

As described above, according to the present embodiment 2, the rail selector 15, selector 7, selector 31, PWM/DAC 9 etc. constitute the first initial setting means for initially setting the output value of the first gain controller (corresponding to the output value AGCRSTA to be supplied to the PWM/DAC 9) in order to set the gain of the first variable gain amplifier at the predetermined gain; and the AND circuit 32, PWM/DAC 14 etc. constitute the second initial setting means for initially setting the output value of the second gain controller (corresponding to the output value zero to be supplied to the PWM/DAC 14) in order to set the gain of the second variable gain amplifier at a maximum or near maximum gain. The configuration comprising the first initial setting means and second initial setting means enables the first gain controller to operate such that it sets the gain of the first variable gain amplifier to a predicted gain when the proper gain corresponding to the modulation scheme is known in advance to a certain extent. This offers an advantage of being able to bring the total gain of the demodulation system to the optimum gain rapidly.

Although the present embodiment 2 is configured such that it initially sets the first variable gain amplifier at the predetermined gain, it is also possible to set the second variable gain amplifier at a predetermined gain. Specifically, such a configuration is possible that comprises the first initial setting means for initially setting the output of the first gain controller at a value for initially setting the first variable gain amplifier at the minimum or near minimum gain; and the second initial setting means for initially setting the output of the second gain controller at a value for initially setting the second variable gain amplifier at the predetermined gain. The configuration enables the second gain controller to set the gain of the second variable gain amplifier to the predicted gain when the proper gain corresponding to the modulation scheme is known in advance to a certain extent. This offers an advantage of being able to bring the total gain of the demodulation system to the optimum gain rapidly.

Embodiment 3

Figure 6:
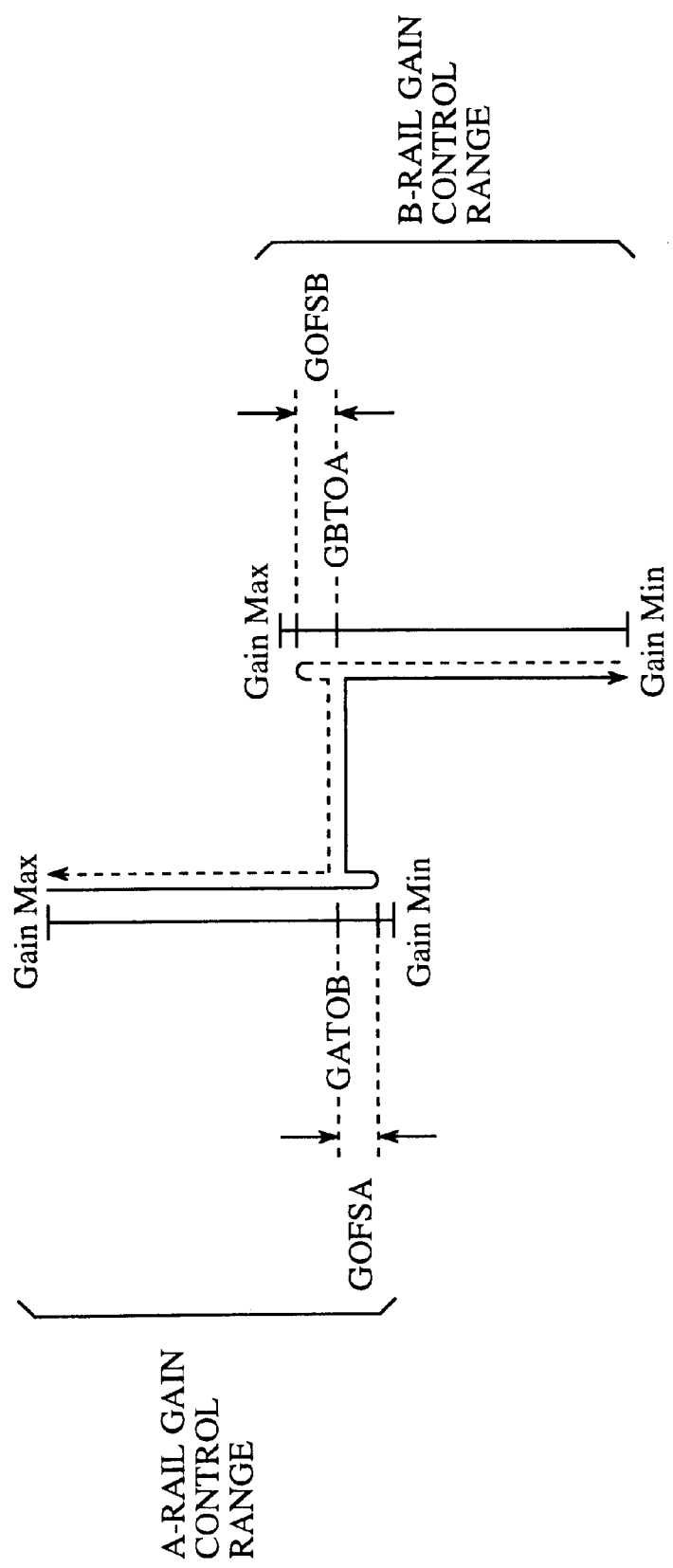
FIG. 6 is a diagram illustrating gain control ranges of the two rails in an embodiment 3 of the AGC circuit in accordance with the present invention.

First, the basic gain control process of an embodiment 3 of the AGC circuit in accordance with the present invention will be described. The configuration of the demodulation system to which the embodiment 3 of the AGC circuit is applied is the same as the demodulation system as shown in FIG. 1A. As in the embodiment 1, the total gain of the demodulation system is considered equal to the sum of the gain of the AGC amplifier (RFAGC) 101A in the tuner 101 and the gain of the AGC amplifier (IFAGC) 103 placed after the bandpass filter 102 in the present embodiment 3. FIG. 6 is a diagram illustrating gain control ranges for individual rails in the embodiment 3 of the AGC circuit 100 in accordance with the present invention. As illustrated in FIG. 6, the AGC circuit 100 carries out the control of the entire demodulation system by dividing the control range into a control range the A-rail takes charge of, and a control range the B-rail takes charge of. Thus, the A-rail and B-rail never change simultaneously. The A-rail control range is placed above the B-rail control range because of the same reason as described in the embodiment 1. The variable GATOB designates the gain of the AGC amplifier connected to the A-rail at the time the gain control shifts from the A-rail to the B-rail, and GBTOA designates the gain of the AGC amplifier connected to the B-rail at the time the gain control shifts from the B-rail to the A-rail. The variables GOFSA and GOFSB designate offset ranges of the gains of the AGC amplifiers connected to the A-rail and to the B-rail. Although the A-rail and B-rail are connected to the IFAGC and RFAGC, respectively, in FIG. 1A, they can be connected to the RFAGC and IFAGC to carry out the gain control.

Next, the basic control operation will be described. First, when no signal is applied to the A/D converter 106, both the A-rail and B-rail wait for the input signal, in which case, both the A-rail and B-rail can be set at the maximum or near maximum gain, or the A-rail can be set at the specified gain corresponding to the modulation scheme and the B-rail can be set at the maximum gain. When the signal is supplied to the A/D converter 106, the AGC circuit 100 controls the A-rail such that the gain of the AGC amplifier connected to the A-rail is reduced, first, with maintaining the gain of the B-rail at the maximum or near maximum gain. When the gain optimizing the amplitude of the input signal to the A/D converter 106 falls below the specified gain near the minimum gain of the A-rail and also the gain offset range, that is, when the amplitude of the input signal to the A/D converter 106 is still greater than the optimum value even if the gain of the A-rail becomes minimum, the AGC circuit fixes the output of the A-rail at the minimum gain, and detects the optimum gain by controlling the B-rail by reducing the gain of the AGC amplifier connected to the B-rail. Likewise, after the control is once shifted from the A-rail to the B-rail, and when the gain optimizing the amplitude of the input signal to the A/D converter 106 exceeds the specified gain near the maximum gain of the B-rail and also the gain offset range, that is, when the amplitude of the input signal to the A/D converter 106 is still smaller than optimum value even if the gain of the B-rail becomes maximum, the AGC circuit fixes the output of the B-rail at the specified near maximum gain, and detects the optimum gain by controlling the A-rail by increasing the gain of the AGC amplifier connected to the A-rail.

Figure 7:
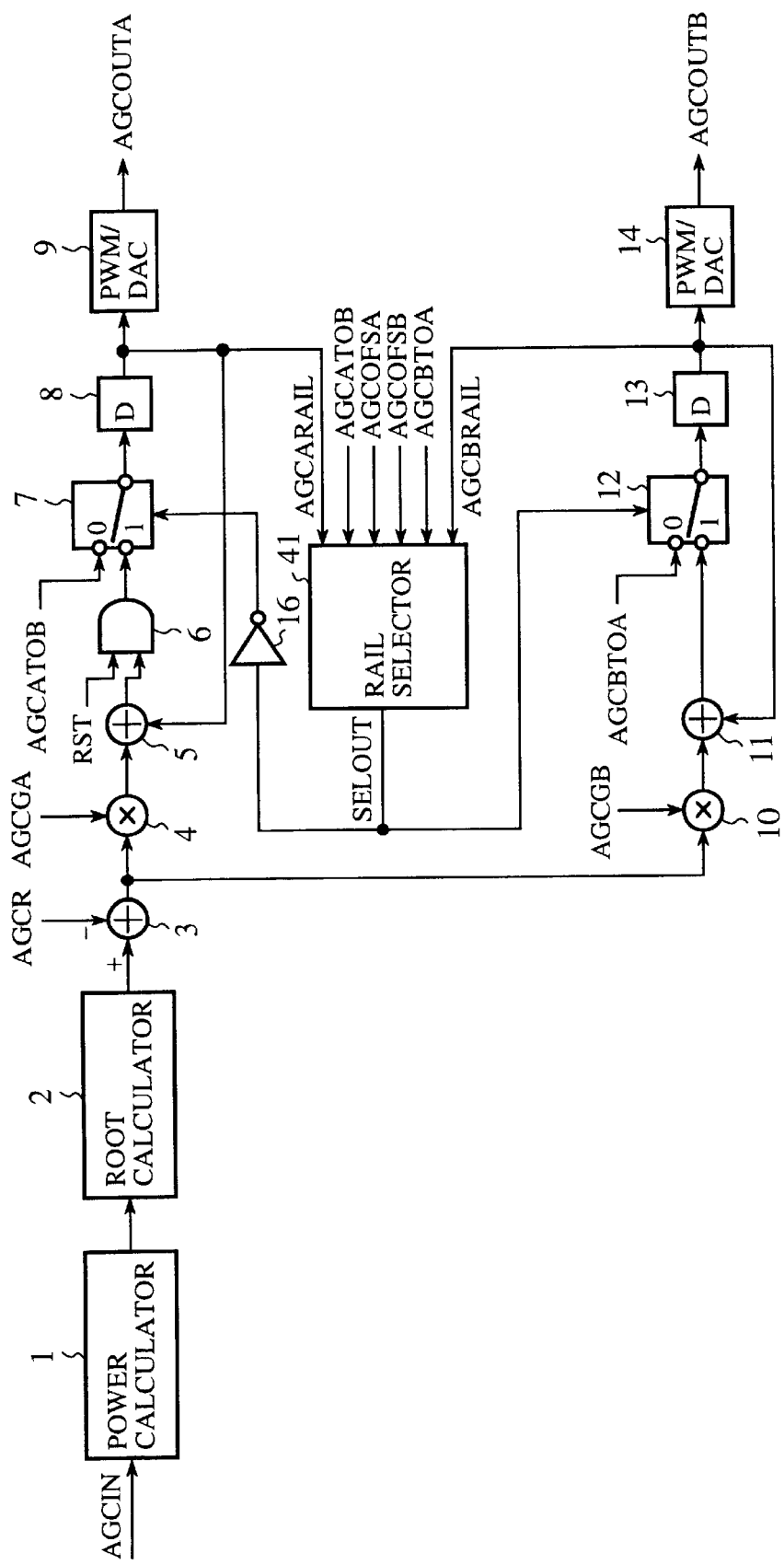
FIG. 7 is a block diagram showing a configuration of the embodiment 3 of the AGC circuit in accordance with the present invention.

FIG. 7 is a block diagram showing a configuration of the embodiment 3 of the AGC circuit in accordance with the present invention. In FIG. 7, the same reference numerals designate the same or like portions to those of FIG. 2, and the description thereof is omitted here. In FIG. 7, the reference numeral 41 designates a rail selector for receiving the A-rail control level AGCARAIL, A-rail specified control level AGCATOB, A-rail control level offset AGCOFSA, B-rail control level AGCBRAIL, B-rail specified control level AGCBTOA and B-rail control level offset AGCOFSB, and for supplying the selector 7 and selector 12 with the selection signal SELOUT. The variable AGCATOB designates the control level corresponding to the specified gain GATOB of the AGC amplifier connected to the A-rail at the control rail transition as illustrated in FIG. 6; and the variable AGCBTOA designates the control level corresponding to the specified gain GBTOA of the AGC amplifier connected to the B-rail at the control rail transition as illustrated in FIG. 6. Accordingly, when the control level AGCATOB is input to the PWM/DAC 9, the gain of the AGC amplifier connected to the A-rail is set at the GATOB, and when the control level AGCBTOA is input to the PWM/DAC 14, the gain of the AGC amplifier connected to the B-rail is set at the GBTOA. The variable AGCOFSA is the control level offset corresponding to the gain offset GOFSA as illustrated in FIG. 6, and the variable AGCOFSB is the control level offset corresponding to the gain offset GOFSB as illustrated in FIG. 6.

Next, the control of the AGC amplifier by the embodiment 3 of the AGC circuit 100 in accordance with the present invention will be described. Since the operations of the individual components except for the rail selector 41 is the same as those in the embodiment 1, the description thereof is omitted here. First, the following control parameters are specified externally: the control level AGCATOB that is fixed in the A-rail when the gain optimizing the amplitude of the input signal to the A/D converter 106 falls below the A-rail control range and the control is switched to the B-rail; the control level offset AGCOFSA for determining the A-rail control range with the AGCATOB; the control level AGCBTOA that is fixed in the B-rail when the gain optimizing the amplitude of the input signal to the A/D converter exceeds the B-rail control range and the control is switched to the A-rail; and the control level offset AGCOFSB for determining the B-rail control range with the AGCBTOA.

Subsequently, when the power is turned on, the rail selector 41 outputs the "L" level rail selection signal so that the PWM/DAC 9 is supplied with the output of the loop filter, and the PWM/DAC 14 is supplied with the specified control level AGCBTOA. In addition, to reset the A-rail loop filter, the AND circuit 6 is supplied with the "L" level reset signal. Thus, the PWM/DAC 9 is supplied with the zero control level. Setting the output of the loop filter at its minimum value in this way is equivalent to bring the AGC amplifier connected to the PWM/DAC 9 into a standby state at the maximum gain under the control of the PWM/DAC 9. In this case, since the input signal at the maximum gain is supplied to the A/D converter 106, the output from the subtracter 3 becomes positive, so that the increasing control level is supplied to the PWM/DAC 9, and the gain of the AGC amplifier connected to the PWM/DAC 9 is gradually reduced. Thus, the PWM/DAC 9 is supplied with the control level that will implement the optimum gain by the effect of the loop filter. In the course of this, the PWM/DAC 14 of the B-rail is continuously supplied with the specified control level AGCBTOA.

Next, if it is necessary to further reduce the gain even when the control level AGCARAIL supplied to the PWM/DAC 9 reaches the specified control level (AGCATOB+AGCOFSA), the rail selector 41 outputs the "H" level rail selection signal to switch the gain control to the B-rail. In this case, the PWM/DAC 9 is supplied with the specified control level AGCATOB, and the PWM/DAC 14 is supplied with the output of the loop filter. If the gain achieved when the B-rail control level is AGCBTOA is still higher than the optimum gain given, the output from the subtracter 3 becomes positive, and the control level supplied to the PWM/DAC 14 is gradually increased so that the gain of the AGC amplifier connected to the PWM/DAC 14 is gradually decreased, so that the control level optimizing the gain is supplied to the PWM/DAC 14 by the effect of the loop filter. In the course of this, the A-rail PWM/DAC 9 is continuously supplied with the specified control level AGCATOB. The reason for adding the control level offset AGCOFSA to the control level AGCATOB to obtain the lower limit value of the gain of the AGC amplifier connected to the PWM/DAC 9 is that the PWM/DAC is configured such that the gain of the AGC amplifier connected thereto is reduced as the control level is increased as described in the foregoing embodiment 1.

In contrast, when the amplitude of the input signal to the A/D converter sharply drops because of a channel switching or the like after the gain becomes stable in the B-rail, the output from the subtracter 3 falls negative so that the control level supplied to the PWM/DAC 14 is gradually reduced and the gain of the AGC amplifier connected to the PWM/DAC 14 is increased, thereby supplying the PWM/DAC 14 with the control level optimizing the gain by the effect of the loop filter.

Next, if it is necessary to further increase the gain even when the control level AGCBRAIL supplied to the PWM/DAC 14 reaches the limit value of the control range (AGCBTOA−AGCOFSB), the rail selector 41 supplies the "L" level rail selection signal to the selector 7 and selector 12 to switch the gain control to the A-rail. In this case, the PWM/DAC 9 is supplied with the output of the loop filter, and the PWM/DAC 14 is supplied with the specified control level AGCBTOA. If the gain achieved when the A-rail control level is AGCATOB is still lower than the optimum gain, the output from the subtracter 3 becomes negative, and the control level supplied to the PWM/DAC 9 is gradually decreased so that the gain of the AGC amplifier connected to the PWM/DAC 9 is gradually increased, and the control level optimizing the gain is supplied to the PWM/DAC 9 by the effect of the loop filter.

As described above, the rail selector 41 halts the operation of the B-rail loop filter while the A-rail loop filter is operating, whereas it stops the operation of the A-rail loop filter while the B-rail loop filter is operating. The control levels smoothed by the loop filters of the A-rail and B-rail are fed back from the PWM or DAC to the pre-stage IFAGC 103 and RFAGC 101A through lowpass filters as a DC component, thereby controlling the average amplitude of the input signal to the A/D converter 106 to be maintained at the fixed value.

Figure 8:
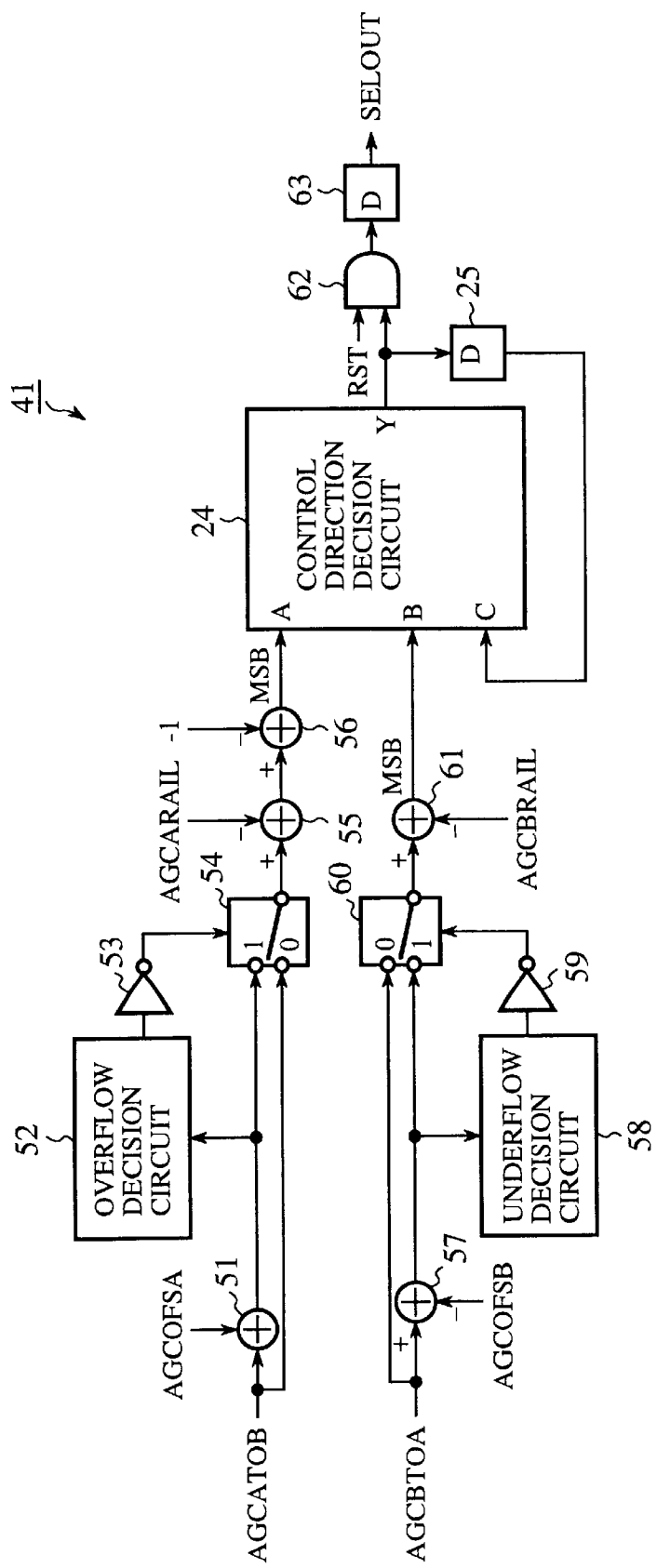
FIG. 8 is a block diagram showing a configuration of a rail selector 41 in the embodiment 3 of the AGC circuit in accordance with the present invention.

Next, the rail selector 41 for switching the gain control between the A-rail and B-rail will be described. FIG. 8 is a block diagram showing a configuration of the rail selector 41 of the present embodiment 3. In FIG. 8, the same reference numerals designate the same or like portions to those of FIG. 3, and the description thereof is omitted here. In FIG. 8, the reference numeral 51 designates an adder for adding the specified control level offset AGCOFSA in the A-rail to the specified control level AGCATOB in the A-rail; 52 designates an overflow decision circuit for deciding as to whether the control level output from the adder 51 exceeds the upper limit of the numerical range the A-rail control level can take; 53 designates an inverter; 54 designates a selector for selecting and outputting a shifting control level (AGCATOB+AGCOFSA) associated with the rail shift in a normal state, and the shifting control level AGCATOB when the overflow takes place; 55 designates a subtracter for subtracting the A-rail control level AGCARAIL from the shifting control level output from the selector 54; 56 designates a subtracter for subtracting one from the least significant bit (LSB) of the output of the subtracter 55, which is represented in a binary number, in order to switch the gain control to the B-rail when the A-rail control level AGCARAIL reaches the shifting control level requiring switching from the A-rail to the B-rail; 57 designates a subtracter for subtracting the specified control level offset AGCOFSB of the B-rail from specified control level AGCBTOA of the B-rail; 58 designates an underflow decision circuit for deciding as to whether the control level output from the subtracter 57 falls below the lower limit of the numerical range the B-rail control level can take; 59 designates an inverter; 60 designates a selector for selecting and outputting a shifting control level (AGCBTOA−AGCOFSB) in a normal state, and the shifting control level AGCBTOA when the underflow takes place; 61 designates a subtracter for subtracting the B-rail control level AGCBRAIL from the shifting control level output from the selector 60; 62 designates an AND circuit for assigning the gain control to the A-rail at the reset; and 63 designates a flip-flop for latching the output from the control direction decision circuit 24. Incidentally, the subtracters operate on the basis of the two's complement binary. Accordingly, the calculation results in both the A-rail and B-rail are output in the two's complement. Thus, the most significant bit (MSB) of a negative output is one.

The control direction decision circuit 24 in the present embodiment 3 uses the truth table as shown in FIG. 9 to decide the control direction. In FIG. 9, A designates the MSB of the output from the subtracter 56; B designates the MSB of the output from the subtracter 61; C designates a decision result in the immediately previous cycle; and Y designates a decision result output from the control direction decision circuit 24. As for the decision result Y, when it is zero, the A-rail is selected, and when it is one the B-rail is selected.

Next, the operation of the rail selector 41 will be described. First, in the rail selector 41, the overflow decision circuit 52 makes a decision as to whether the (AGCATOB+AGCOFSA) is greater than the upper limit of the numerical range the A-rail control level can take. When no overflow takes place, it sets the shifting control level for switching the gain control from the A-rail to the B-rail at (AGCATOB+AGCOFSA), whereas when the overflow takes place, it sets the shifting control level at AGCATOB. On the other hand, the underflow decision circuit 58 makes a decision as to whether the (AGCBTOA−AGCOFSB) is less than the lower limit of the numerical range the B-rail control level can take. When no underflow takes place, it sets the shifting control level for switching the gain control from the B-rail to the A-rail at (AGCBTOA−AGCOFSB), whereas when the underflow takes place, it sets the shifting control level at AGCBTOA. Incidentally, the operation of the rail selector 41 when the overflow or underflow takes place is the same as that of the rail selector 15 in the embodiment 1, it is assumed in the following description that the A-rail shifting control level is set at (AGCATOB+AGCOFSA), and B-rail shifting control level is set at (AGCBTOA−AGCOFSB).

When the "L" level reset signal is output at turn-on, the output of the AND circuit 62, that is, the output of the rail selector 41 is placed at "0". Thus, the control by the A-rail is selected, and the A-rail control level AGCARAIL is placed at "0", and the B-rail control level AGCBRAIL is placed at the specified control level AGCBTOA. Accordingly, the subtraction result of the A-rail subtracter 56 in the rail selector 41 is positive, and the MSB of the subtraction result becomes zero. On the other hand, since the subtraction of the B-rail subtracter 61 is carried out from the shifting control level (AGCBTOA−AGCOFSB), the subtraction result of the subtracter 61 is negative, and its MSB becomes one. In addition, the result of the control direction decision in the immediately previous cycle equals zero because it is just after the reset, resulting in (A, B, C)=(0, 1, 0). In this case, since the output value Y of the control direction decision circuit becomes zero, the gain control by the A-rail is selected.

Subsequently, when the output of the loop filter, which is given as the A-rail control level AGCARAIL, increases and reaches the shifting control level (AGCATOB+AGCOFSA), the subtraction result of the A-rail subtracter 56 becomes negative, and its MSB is placed at one. Since the A-rail is selected in the previous cycle, the input C becomes zero, resulting in (A, B, C)=(1, 1, 0). In this case, the output value Y of the control direction decision circuit 24 is placed at one, so that the gain control is switched from the A-rail to the B-rail, thereby selecting the gain control by the B-rail. Thus, the output SELOUT of the rail selector 41 is switched from the "L" level to "H" level.

When the B-rail is selected, the output control level of the A-rail is fixed at AGCATOB, and since the shifting control level used by the subtraction is (AGCATOB+AGCOFSA), the subtraction result in the A-rail becomes positive or zero, and its MSB becomes zero. As for the B-rail, since the shifting control level is (AGCBTOA−AGCOFSB), and the B-rail control level AGCBRAIL is controlled to be placed at a level equal to or greater than the AGCBTOA, the subtraction result in the B-rail is negative, and its MSB becomes one. In addition, since the B-rail is selected in the previous cycle, the input C is one, resulting in (A, B, C)=(0, 1, 1) which continuously selects the B-rail.

In contrast, when the amplitude of the input signal to the A/D converter drops sharply because of the channel switching or the like after the gain in the B-rail is stabilized, the state (A, B, C)=(0, 1, 1) is held until the B-rail control level AGCBRAIL reaches the shifting control level (AGCBTOA−AGCOFSB). However, once the B-rail control level reaches the shifting control level (AGCBTOA−AGCOFSB), the state changes to (A, B, C)=(0, 0, 1), in which case, the output value Y of the control direction decision circuit 24 is placed at zero so that the gain control is switched to the A-rail, thereby selecting the gain control by the A-rail. Thus, the output of the rail selector 41 is switched from the "H" level to "L" level.

When the A-rail is selected, the B-rail control level is fixed at AGCBTOA, and since the shifting control level used by the subtraction is (AGCBTOA−AGCOFSB), the subtraction result in the B-rail is negative, and its MSB becomes one. As for the A-rail, since its shifting control level is (AGCATOB+AGCOFSA), and the A-rail control level AGCARAIL is controlled to be placed at a level equal to or less than AGCATOB, the subtraction result in the A-rail becomes positive or zero, placing the MSB of the subtraction result at zero. Since the A-rail is selected in the previous cycle, the input C is zero, resulting in (A, B, C)=(0, 1, 0) which selects the A-rail continuously.

The state (A, B, C) of the control direction decision circuit 24 changes as described above. In the truth table as shown in FIG. 9, the states represented by (A, B, C)=(1, 1, 1), (A, B, C)=(1, 0, 1), (A, B, C)=(1, 0, 0) and (A, B, C)=(0, 0, 0) never take place in the actual gain control. Accordingly, the output value Y can take any value in these cases. Here, the decision result for selecting the A-rail is given higher priority.

The output of the control direction decision circuit 24 is supplied to the AND circuit 62 to decide the next control direction. Although the AND circuit 62 for deciding the control direction usually outputs the output of the control direction decision circuit 24, it fixes its output at zero at the reset in order to select the A-rail. The output of the AND circuit 62 for deciding the control direction becomes the output SELOUT of the rail selector 41.

As described above, according to the present embodiment 3, the rail selector 41 including the adder 51, control direction decision circuit 24 etc., the selector 7, PWM/DAC 9 etc. constitute a first offset means for setting, when switching the gain control from the A-rail (first gain controller) to the B-rail (second gain controller), the output of the first gain controller (corresponding to the AGCATOB to be supplied to the PWM/DAC 9) such that the gain of the first variable gain amplifier is maintained at a higher gain (first retaining gain=GATOB) than the gain of the first variable gain amplifier (first switching gain=GATOB−GOFSA) immediately before the switching; and the rail selector 41 including the subtracter 57, control direction decision circuit 24 etc., the selector 12 and PWM/DAC 14 etc. constitute a second offset means for setting, when switching the gain control from the B-rail to the A-rail, the output of the second gain controller (corresponding to the AGCBTOA to be supplied to the PWM/DAC 14) such that the gain of the second variable gain amplifier is maintained at a gain (second retaining gain=GBTOA) lower than the gain of the second variable gain amplifier (second switching gain=GBTOA+GOFSB) immediately before the switching. The configuration comprising the first offset means and the second offset means makes it possible for the entire demodulation system to carry out the gain control by using either the first gain controller or the second gain controller in an overlapped section between the first retaining gain and the first switching gain or in an overlapped section between the second switching gain and the second retaining gain. This offers an advantage of being able to prevent the gain controllers carrying out the gain control from being alternately switched frequently even when the optimum gain is close to the switching gain, thereby avoiding the unstable state of the total gain of the demodulation system.

Figure 10:
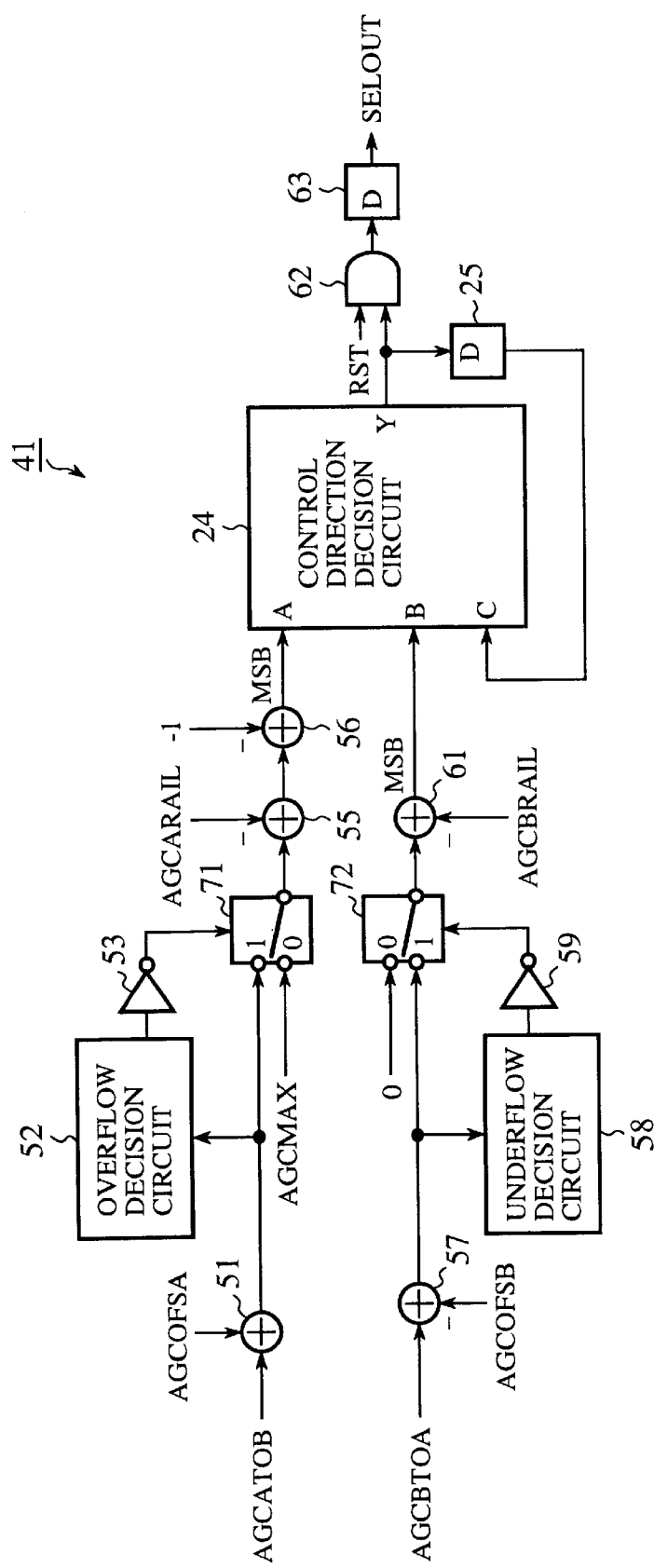
FIG. 10 is a block diagram showing another configuration of the rail selector 41 in the embodiment 3 of the AGC circuit in accordance with the present invention.

Although the rail selector 41 sets the shifting control level of the overflow at the AGCATOB, and that of the underflow at the AGCBTOA in the present embodiment 3, this is not essential. For example, as illustrated in FIG. 10, the shifting control level of the overflow can be set at AGCMAX corresponding to the minimum gain of the AGC amplifier connected to the A-rail, and the shifting control level of the underflow can be set at zero corresponding to the maximum gain of the AGC amplifier connected to the B-rail. In this case, the effect similar to that of FIG. 8 can be obtained.

Embodiment 4

Figure 11:
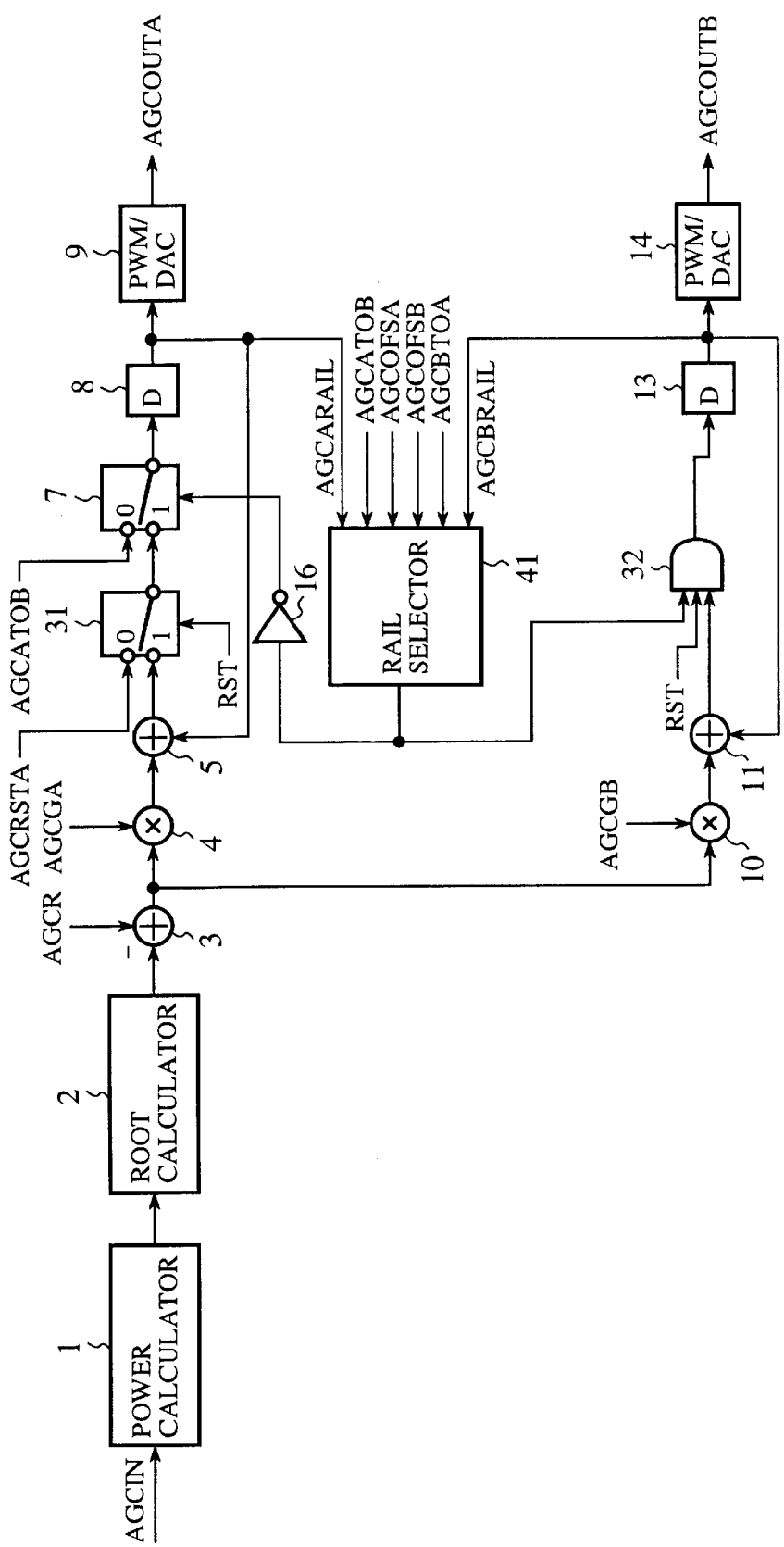
FIG. 11 is a block diagram showing a configuration of an embodiment 4 of the AGC circuit in accordance with the present invention.
Figure 12:
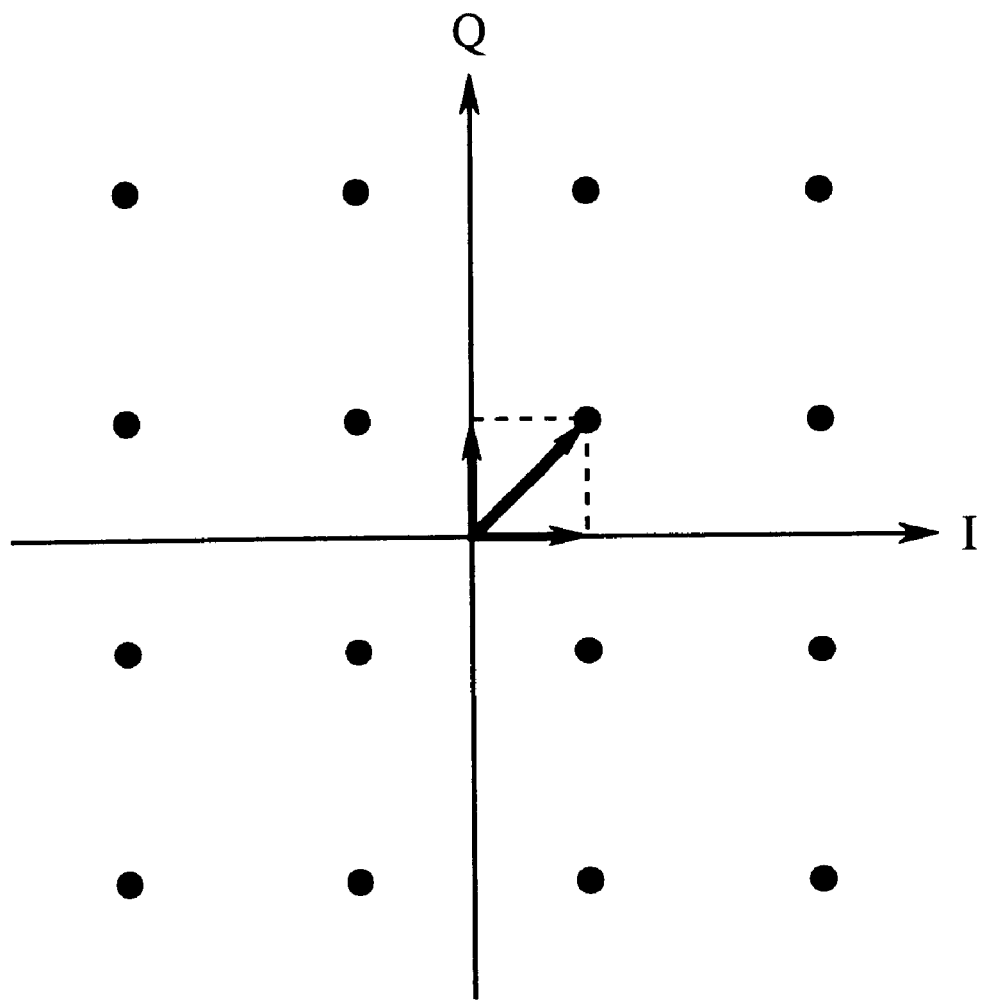
FIG. 12 is a diagram illustrating a vector constellation of 16 QAM.

FIG. 11 is a block diagram showing a configuration of an embodiment 4 of the AGC circuit in accordance with the present invention. In FIG. 11, the same reference numerals designate the same or like portions to those of FIGS. 5 and 7, and the description thereof is omitted here. The control operation of the AGC amplifier is basically the same as that of the AGC amplifier of the embodiment 3 except for the operation of the selector 31 and AND circuit 32. However, since the operation of the selector 31 and AND circuit 32 is described in connection with the embodiment 2, the description thereof is omitted here. In short, the embodiment 4 of the AGC circuit can be expressed as incorporating the feature of the embodiment 2 of the AGC circuit into the embodiment 3 of the AGC circuit.

The present embodiment 4 is configured such that it comprises the first offset means and second offset means as in the embodiment 3. This configuration makes it possible for the entire demodulation system to carry out the gain control by using either the first gain controller or the second gain controller in an overlapped section between the first retaining gain and the first switching gain or in an overlapped section between the second switching gain and the second retaining gain. This offers an advantage of being able to prevent the gain controllers carrying out the gain control from being alternately switched frequently even when the optimum gain is close to the switching gain, thereby avoiding the unstable state of the total gain of the demodulation system.

In addition, the present embodiment 4 is configured such that it comprises the first initial setting means for initially setting the output value of the first gain controller in order to set the gain of the first variable gain amplifier at the predetermined gain; and the second initial setting means for initially setting the output value of the second gain controller in order to set the gain of the second variable gain amplifier at the maximum or near maximum gain. The configuration enables the first gain controller to set the gain of the first variable gain amplifier to the predicted gain when the proper gain corresponding to the modulation scheme is known in advance to a certain extent. This offers an advantage of being able to bring the total gain of the demodulation system to the optimum gain rapidly.

What is claimed is:

1. An automatic gain control circuit installed in a demodulation system that includes a first variable gain amplifier, a second variable gain amplifier, an A/D converter for carrying out analog-to-digital conversion of a modulation wave and a demodulator for demodulating the modulation wave to recover transmitted digital data, said automatic gain control circuit controlling a gain of the first variable gain amplifier and a gain of the second variable gain amplifier to maintain average amplitude of the modulation wave to be supplied to the A/D converter at a fixed value, said automatic gain control circuit comprising:
   a power calculator for calculating power of a modulation wave supplied to the demodulator;
   a power comparator for comparing the power calculated by said power calculator with ideal power of a modulation scheme of the modulation signal;
   a first gain controller for carrying out gain control of the first variable gain amplifier in response to an output of said power comparator; and
   a second gain controller for carrying out gain control of the second variable gain amplifier in response to the output of said power comparator and independently of the first gain controller.

2. The automatic gain control circuit according to claim 1, further comprising selecting means for selecting one of first gain control by said first gain controller and second gain control by said second gain controller in response to a total gain of the demodulation system.

3. The automatic gain control circuit according to claim 2, further comprising:
   first gain fixing means for retaining, while said selecting means selects the second gain control by said second gain controller, a gain of the first variable gain amplifier at a minimum or near minimum gain by fixing an output of said first gain controller; and
   second gain fixing means for retaining, while said selecting means selects the first gain control by said first gain controller, a gain of the second variable gain amplifier at a maximum or near maximum gain by fixing an output of said second gain controller.

4. The automatic gain control circuit according to claim 3, further comprising:
   first shift gain setting means for setting, when the gain control shifts from said first gain controller to said second gain controller, an output of said first gain controller such that the gain of said first variable gain amplifier is retained at a gain of said first variable gain amplifier at the gain control shift; and
   second shift gain setting means for setting, when the gain control shifts from said second gain controller to said first gain controller, an output of said second gain controller such that the gain of said second variable gain amplifier is retained at a gain of said second variable gain amplifier at the gain control shift.

5. The automatic gain control circuit according to claim 3, further comprising:
   first offset setting means for setting, when the gain control shifts from said first gain controller to said second gain controller, an output of said first gain controller such that the gain of the first variable gain amplifier is retained at a gain higher than the gain of the first variable gain amplifier immediately before the gain control shift; and
   second offset setting means for setting, when the gain control shifts from said second gain controller to said first gain controller, an output of said second gain controller such that the gain of the second variable gain amplifier is retained at a gain lower than the gain of the second variable gain amplifier immediately before the gain control shift.

6. The automatic gain control circuit according to claim 4, further comprising:
   first initial setting means for initially setting the output of said first gain controller such that the gain of the first variable gain amplifier is initially set at a maximum or near maximum gain; and
   second initial setting means for initially setting the output of said second gain controller such that the gain of the second variable gain amplifier is initially set at a maximum or near maximum gain.

7. The automatic gain control circuit according to claim 4, further comprising:
   first initial setting means for initially setting the output of said first gain controller such that the gain of the first variable gain amplifier is initially set at a predetermined gain; and
   second initial setting means for initially setting the output of said second gain controller such that the gain of the second variable gain amplifier is initially set at a maximum or near maximum gain.

8. The automatic gain control circuit according to claim 4, further comprising:

first initial setting means for initially setting the output of said first gain controller such that the gain of the first variable gain amplifier is initially set at a minimum or near minimum gain; and second initial setting means for initially setting the output of said second gain controller such that the gain of the second variable gain amplifier is initially set at a predetermined gain.

9. The automatic gain control circuit according to claim 5, further comprising:

first initial setting means for initially setting the output of said first gain controller such that the gain of the first variable gain amplifier is initially set at a maximum or near maximum gain; and second initial setting means for initially setting the output of said second gain controller such that the gain of the second variable gain amplifier is initially set at a maximum or near maximum gain.

10. The automatic gain control circuit according to claim 5, further comprising:

first initial setting means for initially setting the output of said first gain controller such that the gain of the first variable gain amplifier is initially set at a predetermined gain; and second initial setting means for initially setting the output of said second gain controller such that the gain of the second variable gain amplifier is initially set at a maximum or near maximum gain.

11. The automatic gain control circuit according to claim 5, further comprising:

first initial setting means for initially setting the output of said first gain controller such that the gain of the first variable gain amplifier is initially set at a minimum or near minimum gain; and second initial setting means for initially setting the output of said second gain controller such that the gain of the second variable gain amplifier is initially set at a predetermined gain.

* * * * *